United States Patent
Suzuki et al.

(10) Patent No.: US 6,899,989 B2
(45) Date of Patent: May 31, 2005

(54) RADIATION-SENSITIVE RESIN COMPOSITION

(75) Inventors: Aki Suzuki, Mie (JP); Makoto Murata, Mie (JP); Hiromichi Hara, Mie (JP); Eiichi Kobayashi, Mie (JP)

(73) Assignee: JSR Corporation, Tokyo (JP)

( * ) Notice: Subject to any disclaimer, the term of this patent is extended or adjusted under 35 U.S.C. 154(b) by 406 days.

(21) Appl. No.: 09/987,916

(22) Filed: Nov. 16, 2001

(65) Prior Publication Data

US 2002/0090569 A1 Jul. 11, 2002

(30) Foreign Application Priority Data

Nov. 16, 2000 (JP) ......................................... 2000-350227

(51) Int. Cl.$^7$ ............................................. G03F 7/004
(52) U.S. Cl. .................... 430/270.1; 430/905; 430/913; 430/914; 430/917; 430/921
(58) Field of Search ............................. 430/270.1, 905, 430/913, 914, 917, 921

(56) References Cited

U.S. PATENT DOCUMENTS

| | | |
|---|---|---|
| 5,215,857 A | 6/1993 | Hosaka et al. |
| 5,238,774 A | 8/1993 | Hosaka et al. |
| 5,405,720 A | 4/1995 | Hosaka et al. |
| 5,494,784 A | 2/1996 | Hosaka et al. |
| 5,925,492 A | 7/1999 | Hosaka et al. |
| 6,020,104 A | 2/2000 | Hosaka et al. |
| RE37,179 E | 5/2001 | Yamachika et al. |
| 6,228,554 B1 | 5/2001 | Hosaka et al. |
| 6,270,939 B1 | 8/2001 | Hosaka et al. |
| 6,280,900 B1 | 8/2001 | Chiba et al. |
| 6,337,171 B1 | 1/2002 | Kobayashi et al. |

FOREIGN PATENT DOCUMENTS

| | | | | |
|---|---|---|---|---|
| EP | 794457 | * | 9/1997 | .......... G03F/7/004 |
| EP | 908783 | * | 4/1999 | .......... G03F/7/039 |
| EP | 1117002 A1 | * | 7/2001 | .......... G03F/7/004 |
| EP | 1267210 | * | 12/2002 | .......... G03F/7/004 |
| JP | 60-191372 | | 9/1985 | |
| JP | 61-212131 | | 9/1986 | |
| JP | 03-232652 | | 10/1991 | |
| JP | 11-282163 | * | 10/1999 | |
| JP | 2000-231194 | * | 8/2000 | .......... G03F/7/039 |
| JP | 2000-284482 | | 10/2000 | |

OTHER PUBLICATIONS

English language abstract of JP 11–282163.*
English language abstract of JP 2000–231194.*
Jiro Nakamura, et al., "Resist Surface Roughness Calculated using Theoretical Percolation Model", Journal of Photopolymer Science and Technology, vol. 11, No. 4, pp. 571–576, (1998).
Peter Zandbergen, et al., "Characterization and optimization of positive tone DUV resists on TiN substrates", SPIE vol. 3049, pp. 314–323.

(Continued)

Primary Examiner—Amanda Walke
(74) Attorney, Agent, or Firm—Steven B. Kelber; DLA Piper Rudnick Gary Cary US LLP

(57) ABSTRACT

A radiation-sensitive resin composition comprising (A) a photoacid generator such as 2,4,6-trimethylphenyldiphenylsulfonium 2,4-difluorobenzenesulfonate or 2,4,6-trimethylphenyldiphenylsulfonium 4-trifluoromethylbenzenesulfonate and (B) a resin having an acetal structure typified by a poly(p-hydroxystyrene) resin in which a part of hydrogen atoms of phenolic hydroxyl groups have been replaced by 1-ethoxyethyl groups, 1-ethoxyethyl groups and t-butoxycarbonyl groups, or 1-ethoxyethyl groups and t-butyl groups. The resin composition is sensitive to deep ultraviolet rays and charged particles such as electron beams, exhibits excellent resolution performance and pattern shape-forming capability, and suppresses a nano-edge roughness phenomenon to a minimal extent.

21 Claims, 1 Drawing Sheet

OTHER PUBLICATIONS

Eishi Shiobara, et al., "Resist Edge Roughness with Reducing Pattern Size", SPIE vol. 3333, pp. 313–323.

S.C. Palmateer, et al., "Line Edge Roughness in sub–0.18-$\mu$m Resist Patterns", SPIE vol. 3333, pp. 634–642.

Hideo Namatsu, et al., "Three–dimensional siloxane resist for the formation of nanopatterns with minimum linewidth fluctuations", J. Vac. Sci. Technol. B, vol. 16, No. 1, pp. 69–76 (1998).

U.S. Appl. No. 08/053,500, filed Apr. 28, 1993, Pending.
U.S. Appl. No. 08/797,620, filed, Feb. 7, 1997, Pending.
U.S. Appl. No. 09/197,699 filed, Nov. 23, 1998, Pending.
U.S. Appl. No. 09/558,067, filed Apr. 26, 2000, Pending.
U.S. Appl. No. 09/662,160, filed Sep. 14, 2000, Pending.
U.S. Appl. No. 09/707,939 filed Nov. 8, 2000, Pending.
U.S. Appl. No. 09/741,334 filed Dec. 21, 2000, Pending.
U.S. Appl. No. 09/774,714, filed Feb. 1, 2001, Pending.
U.S. Appl. No. 09/824,224, filed Apr. 3, 2001, Pending.
U.S. Appl. No. 09/874,977, filed Jun. 7, 2001, Pending.
U.S. Appl. No. 09/878,274, filed Jun. 12, 2001, Pending.
U.S. Appl. No. 09/879,894, filed Jun. 14, 2001, Pending.
U.S. Appl. No. 09/953,941, filed Sep. 18, 2001, Pending.
U.S. Appl. No. 09/987,916, filed Nov. 16, 2001, Pending.

\* cited by examiner

RADIATION-SENSITIVE RESIN COMPOSITION

BACKGROUND OF THE INVENTION

1. Field of the Invention

The present invention relates to a radiation-sensitive resin composition useful as a chemically amplified resist for microfabrication using various radiations, in particular, deep ultraviolet rays such as a KrF excimer laser and ArF excimer laser, charged particle rays such as electron beams, and X-rays.

2. Description of the Background Art

In the field of microfabrication exemplified by the manufacture of an integrated circuit device, development of a lithographic process capable of reproducing microfabrication with a line-width precision of 0.5 µm or less has been pursued in recent years to achieve higher integration. To ensure microfabrication in the order of 0.5 µm or less, a resist which can excellently reproduce patterns with a 0.5 µm or less line-width has been required. However, it is difficult to produce such a minute pattern at high precision by conventional methods using visible light (wavelength: 800–400 nm) or near ultraviolet light (wavelength: 400–300 nm). For this reason, the use of radiation with a shorter wavelength (wavelength: less than 300 nm) has been studied.

As examples of such short wavelength radiation, a bright line spectrum of a mercury lamp (wavelength: 254 nm), deep ultraviolet rays typified by a KrF excimer laser (wavelength: 248 nm) and an ArF excimer laser (wavelength: 193 nm), charged particles such as electron beams, and X-rays such as synchrotron radiation can be given. Of these, lithography using an excimer laser is regarded as promising due to high output and high efficiency. Lithography using an excimer laser requires a resist which can reproduce fine patterns with a dimension of 0.5 µm or less at high sensitivity and high resolution.

Chemically amplified resists comprising a photoacid generator which forms an acid upon irradiation with radioactive rays (hereinafter called "exposure") have been proposed as resists applicable to deep ultraviolet ray such as an excimer laser. The sensitivity of the chemically amplified resist is increased by the catalytic action of the acid thus formed.

As such a chemically amplified resist, Japanese Patent Application Laid-open No. 45439/1984 discloses a combination of a resin protected with a t-butyl group or a t-butoxycarbonyl group and a photoacid generator. Japanese Patent Application Laid-open No. 52845/1985 discloses a combination of a resin protected by a silyl group and a photoacid generator. In addition to these resist compositions, there are a number of reports dealing with chemically amplified resists, such as a resist which contains a resin protected by an acetal group or a ketal group and a photoacid generator (Japanese Patent Application Laid-open No. 25850/1990).

Of these chemically amplified resists, those in which a resin having an acetal group or ketal group is used are attracting attention due to their high resolution capability (e.g. Proc. SPIE Vol. 3049, Page 314).

However, when a stringent line-width control is required such as in the case of fabricating devices with sub-half micron or less dimensions, resolution capability alone is insufficient. Excellent film surface smoothness after formation a resist pattern is also important. If a chemically amplified resist exhibiting poor film surface smoothness is used, irregularities (such as nano edge roughness) on the film surface is transferred to a substrate when a resist pattern is transferred to the substrate by an etching process or the like, giving rise to a decrease in dimensional accuracy and impaired electric performance in the ultimate devices (see, for example, J. Photopolym. Sci. Tech. P 571, 1998; Proc. SPIE Vol. 3333, p 313; Proc. SPIE Vol. 3333, p 634; and J. Vac. Sci. Technol. B16(1), 1998, p 69).

Development of a chemically amplified resist exhibiting excellent resolution and only slight nano edge roughness has therefore been desired.

In more recently, a chemically amplified resist containing a resin having an acetal group or a ketal group and one or more compounds selected from the group consisting of a diazomethane compound, triphenylsulfonium organic sulfonate compound, and diphenyliodonium organic sulfonate compound as a photoacid generator was proposed in Japanese Patent Application Laid-open No. 2000-284482. The inventors claimed that the resist possesses excellent characteristics such as high sensitivity and resolution capability, and to exhibit only minimal roughness on the pattern sidewalls.

However, development of a photoacid generator used for a chemically amplified resist containing a resin having an acetal group or a ketal group, particularly a resist exhibiting excellent resolution performance and small nano-edge roughness, has only just started. Successful development of a photoacid generator capable of deriving excellent performance from this type of chemically amplified resist is strongly desired from the viewpoint of development of technologies applicable to semiconductor devices which are increasingly being downsized.

An object of the present invention is to provide a radiation-sensitive resin composition useful as a chemically-amplified resist, sensitive to various radiations, particularly to far ultraviolet rays typified by a KrF excimer laser (wavelength: 248 nm), an ArF excimer laser (wavelength: 193 nm), or an F2 excimer laser (wavelength: 157 nm), as well as charged particles such as electron beams, exhibiting excellent resolution performance and pattern shape-forming capability, and suffering from a nano-edge roughness phenomenon only to a minimal extent.

SUMMARY OF THE INVENTION

The above object can be achieved in the present invention by a radiation-sensitive resin composition comprising:

(A) a photoacid generator which is a compound comprising a structure shown by the following formula (1-a) and a structure shown by the following formula (1-b),

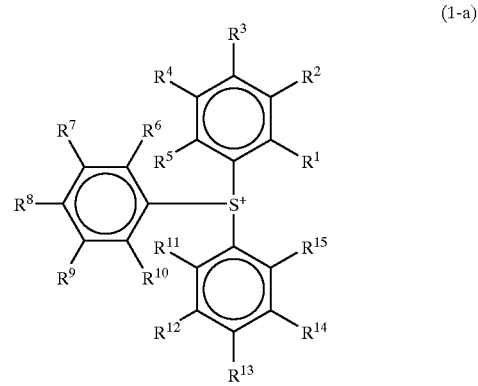

(1-a)

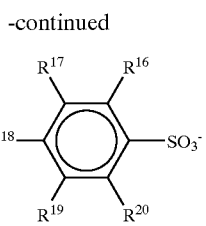
(1-b)

wherein the groups $R^1$ to $R^{15}$ individually represent a hydrogen atom, a hydroxyl group, a linear, branched, or cyclic alkyl group having 1–10 carbon atoms, a linear, branched, or cyclic alkoxyl group having 1–10 carbon atoms, or a t-butoxycarbonylmethoxy group, provided that two or more of the groups $R^1$ to $R^5$ are groups other than the hydrogen atom, two or more of the groups $R^6$ to $R^{10}$ are groups other than the hydrogen atom, or two or more of the groups $R^{11}$ to $R^{15}$ are groups other than the hydrogen atom; and the groups $R^{16}$ to $R^{20}$ individually represent a hydrogen atom, fluorine atom, or trifluoromethyl group, provided that at least one of the groups $R^{16}$ to $R^{20}$ is a fluorine atom or trifluoromethyl group, and (B) a resin comprising a recurring unit shown by the following formula (2),

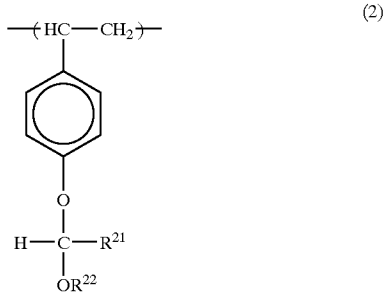
(2)

wherein $R^{21}$ represents a methyl group or ethyl group, and R represents a linear, branched, or cyclic alkyl group having 1–6 carbon atoms, and a recurring unit shown by the following formula (3).

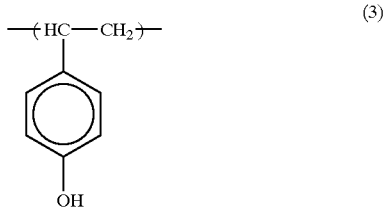
(3)

Other objects, features and advantages of the invention will hereinafter become more readily apparent from the following description.

DETAILED DESCRIPTION OF THE INVENTION AND PREFERRED EMBODIMENTS

Figure 1:
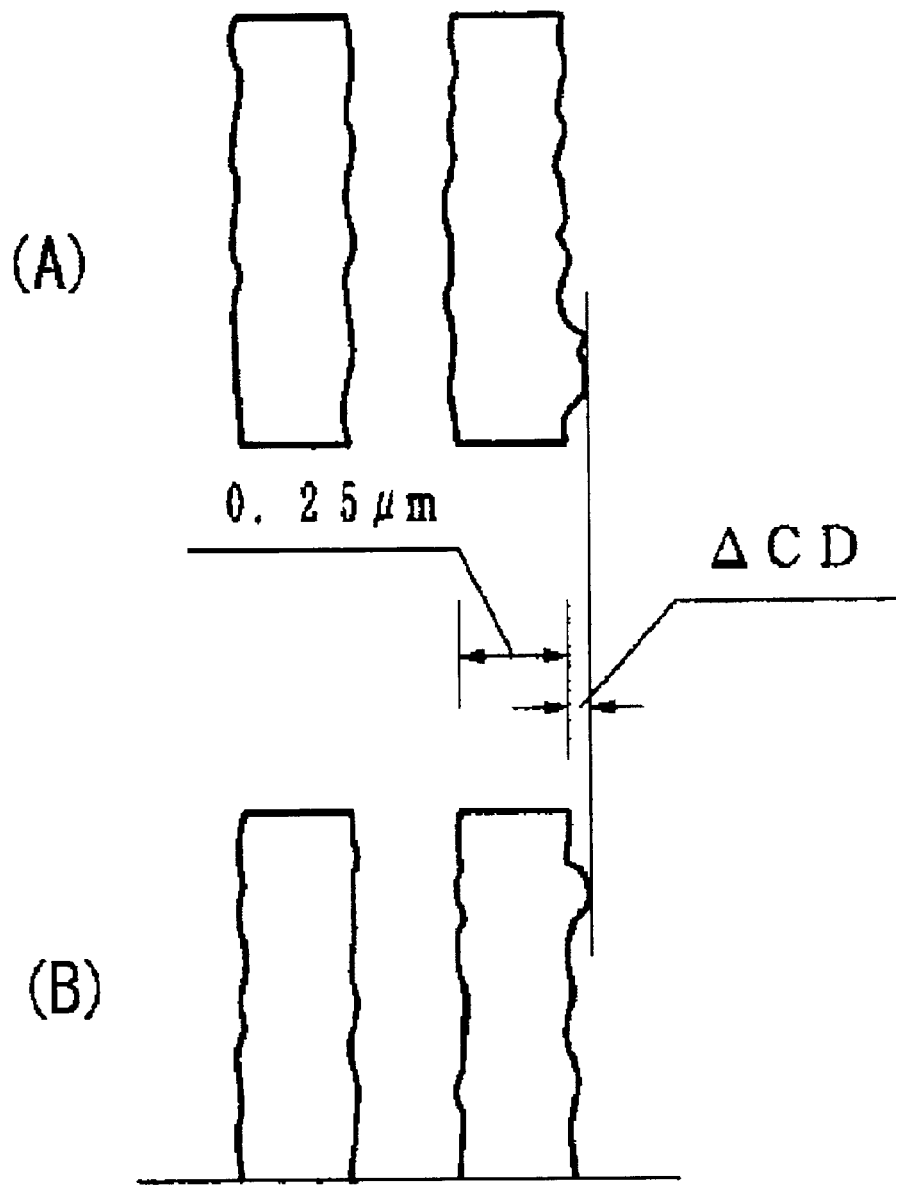
FIG. 1 is a drawing illustrating a dimension for evaluating nano-edge roughness.

The present invention will be described in detail below.
Acid Generator (A)

The component (A) of the present invention is a photoacid generator having the structures represented by the above formulas (1-a) and (1-b) (hereinafter referred to as "acid generator (A)").

Given as examples of the linear, branched, or cyclic alkyl group having 1–10 carbon atoms represented by $R^1$ to $R^{15}$ in the formula (1-a) are a methyl group, ethyl group, n-propyl group, i-propyl group, n-butyl group, i-butyl group, sec-butyl group, t-butyl group, n-pentyl group, neopentyl group, 2-methyl-1-butyl group, 2-methyl-2-butyl group, n-hexyl group, n-heptyl group, n-octyl group, 2-ethylhexyl group, n-nonyl group, n-decyl group, cyclopentyl group, and cyclohexyl group, and the like.

As examples of the linear, branched, or cyclic alkoxyl group having 1–10 carbon atoms represented by $R^1$ to $R^{15}$ are a methoxy group, ethoxy group, n-propoxy group, i-propoxy group, n-butoxy group, i-butoxy group, sec-butoxy group, t-butoxy group, n-pentyloxy group, neopentyloxy group, 2-methyl-1-butoxy group, 2-methyl-2-butoxy group, n-hexyloxy group, n-heptyloxy group, n-octyloxy group, 2-ethylhexyloxy group, n-nonyloxy group, n-decyloxy group, cyclopentyloxy group, and cyclohexyloxy group, and the like.

At least one condition that two or more of the groups $R^1$ to $R^5$ are a group other than the hydrogen atom, two or more of the groups $R^6$ to $R^{10}$ are a group other than the hydrogen atom, or two or more of the groups $R^{11}$ to $R^{15}$ are a group other than the hydrogen atom must be satisfied in the formula (1-a).

In the case where two or more of the groups $R^1$ to $R^5$, two or more of the groups $R^6$ to $R^{10}$, or two or more of the groups $R^{11}$ to $R^{15}$ are a group other than the hydrogen atom, such a group other than the hydrogen atom is preferably a hydroxyl group, methyl group, ethyl group, n-propyl group, i-propyl group, n-butyl group, i-butyl group, sec-butyl group, t-butyl group, methoxy group, t-butoxy group, or t-butoxycarbonylmethoxy group, with a particularly preferable group being a methyl group, ethyl group, i-propyl group, t-butoxy group, or t-butoxycarbonylmethoxy group.

The structure represented by the above formula (1-a) is hereinafter referred to as a "sulfonium cation (a)" and the structure represented by the above formula (1-b) is referred to as a "sulfonate anion (b)".

The following compounds can be given as specific examples of the sulfonium cation (a):
2,3-dihydroxyphenyldiphenylsulfonium cation,
2,4-dihydroxyphenyldiphenylsulfonium cation,
2,5-dihydroxyphenyldiphenylsulfonium cation,
2,6-dihydroxyphenyldiphenylsulfonium cation,
3,4-dihydroxyphenyldiphenylsulfonium cation,
3,5-dihydroxyphenyldiphenylsulfonium cation,
2,4,6-trihydroxyphenyldiphenylsulfonium cation,
2-hydroxy-3-methylphenyldiphenylsulfonium cation,
2-hydroxy-4-methylphenyldiphenylsulfonium cation,
2-hydroxy-5-methylphenyldiphenylsulfonium cation,
2-hydroxy-6-methylphenyldiphenylsulfonium cation,
3-hydroxy-4-methylphenyldiphenylsulfonium cation,
3-hydroxy-5-methylphenyldiphenylsulfonium cation,
2-methyl-3-hydroxyphenyldiphenylsulfonium cation,
2-methyl-4-hydroxyphenyldiphenylsulfonium cation,
2-methyl-5-hydroxyphenyldiphenylsulfonium cation,
3-methyl-4-hydroxyphenyldiphenylsulfonium cation,
2-hydroxy-3-methoxyphenyldiphenylsulfonium cation,
2-hydroxy-4-methoxyphenyldiphenylsulfonium cation,
2-hydroxy-5-methoxyphenyldiphenylsulfonium cation,
2-hydroxy-6-methoxyphenyldiphenylsulfonium cation,
3-hydroxy-4-methoxyphenyldiphenylsulfonium cation,
3-hydroxy-5-methoxyphenyldiphenylsulfonium cation,
2-methoxy-3-hydroxyphenyldiphenylsulfonium cation, 2-methoxy-4-hydroxyphenyldiphenylsulfonium cation,
2-methoxy-5-hydroxyphenyldiphenylsulfonium cation,
3-methoxy-4-hydroxyphenyldiphenylsulfonium cation,
2-hydroxy-3-t-butoxyphenyldiphenylsulfonium cation,
2-hydroxy-4-t-butoxyphenyldiphenylsulfonium cation,
2-hydroxy-5-t-butoxyphenyldiphenylsulfonium cation,
2-hydroxy-6-t-butoxyphenyldiphenylsulfonium cation,
3-hydroxy-4-t-butoxyphenyldiphenylsulfonium cation,
3-hydroxy-5-t-butoxyphenyldiphenylsulfonium cation,
2-t-butoxy-3-hydroxyphenyldiphenylsulfonium cation,
2-t-butoxy-4-hydroxyphenyldiphenylsulfonium cation,
2-t-butoxy-5-hydroxyphenyldiphenylsulfonium cation,
3-t-butoxy-4-hydroxyphenyldiphenylsulfonium cation,
2-hydroxy-3-t-butoxycarbonylmethoxyphenyldiphenylsulfonium cation,
2-hydroxy-4-t-butoxycarbonylmethoxyphenyldiphenylsulfonium cation,
2-hydroxy-5-t-butoxycarbonylmethoxyphenyldiphenylsulfonium cation,
2-hydroxy-6-t-butoxycarbonylmethoxyphenyldiphenylsulfonium cation,
3-hydroxy-4-t-butoxycarbonylmethoxyphenyldiphenylsulfonium cation,
3-hydroxy-5-t-butoxycarbonylmethoxyphenyldiphenylsulfonium cation,
2-t-butoxycarbonylmethoxy-3-hydroxyphenyldiphenylsulfonium cation,
2-t-butoxycarbonylmethoxy-4-hydroxyphenyldiphenylsulfonium cation,
2-t-butoxycarbonylmethoxy-5-hydroxyphenyldiphenylsulfonium cation,
3-t-butoxycarbonylmethoxy-4-hydroxyphenyldiphenylsulfonium cation,
2,3-dimethylphenyldiphenylsulfonium cation,
2,4-dimethylphenyldiphenylsulfonium cation,
2,5-dimethylphenyldiphenylsulfonium cation,
2,6-dimethylphenyldiphenylsulfonium cation,
3,4-dimethylphenyldiphenylsulfonium cation,
3,5-dimethylphenyldiphenylsulfonium cation,
2,4,6-trimethylphenyldiphenylsulfonium cation,
2,3-diethylphenyldiphenylsulfonium cation,
2,4-diethylphenyldiphenylsulfonium cation,
2,5-diethylphenyldiphenylsulfonium cation,
2,6-diethylphenyldiphenylsulfonium cation,
3,4-diethylphenyldiphenylsulfonium cation,
3,5-diethylphenyldiphenylsulfonium cation,
2,4,6-triethylphenyldiphenylsulfonium cation,
2,4-di-n-propylphenyldiphenylsulfonium cation,
2,4,6-tri-n-propylphenyldiphenylsulfonium cation,
2,4-di-i-propylphenyldiphenylsulfonium cation,
2,4,6-tri-i-propylphenyldiphenylsulfonium cation,
2,4-di-n-butylphenyldiphenylsulfonium cation,
2,4,6-tri-n-butylphenyldiphenylsulfonium cation,
2,4-di-i-butylphenyldiphenylsulfonium cation,
2,4,6-tri-i-butylphenyldiphenylsulfonium cation,
2,4-di-sec-butylphenyldiphenylsulfonium cation,
2,4,6-tri-sec-butylphenyldiphenylsulfonium cation,
2,4-di-t-butylphenyldiphenylsulfonium cation,
2,4,6-tri-t-butylphenyldiphenylsulfonium cation,
2-methyl-4-n-propylphenyldiphenylsulfonium cation,
2-methyl-4-i-propylphenyldiphenylsulfonium cation,
2-methyl-4-n-butylphenyldiphenylsulfonium cation,
2-methyl-4-t-butylphenyldiphenylsulfonium cation,
2-methyl-4-n-hexylphenyldiphenylsulfonium cation,
2-methyl-4-n-octylphenyldiphenylsulfonium cation,
2-methyl-4-n-decylphenyldiphenylsulfonium cation,
2-methyl-4-n-cyclohexylphenyldiphenylsulfonium cation,
2-methyl-3-methoxyphenyldiphenylsulfonium cation,
2-methyl-4-methoxyphenyldiphenylsulfonium cation,
2-methyl-5-methoxyphenyldiphenylsulfonium cation,
2-methyl-6-methoxyphenyldiphenylsulfonium cation,
3-methyl-4-methoxyphenyldiphenylsulfonium cation,
3-methyl-5-methoxyphenyldiphenylsulfonium cation,
2-methoxy-3-methylphenyldiphenylsulfonium cation,
2-methoxy-4-methylphenyldiphenylsulfonium cation,
2-methoxy-5-methylphenyldiphenylsulfonium cation,
3-methoxy-4-methylphenyldiphenylsulfonium cation,
2-methyl-4-n-propoxyphenyldiphenylsulfonium cation,
2-methyl-4-i-propoxyphenyldiphenylsulfonium cation,
2-methyl-4-n-butoxyphenyldiphenylsulfonium cation,
2-methyl-4-n-hexyloxyphenyldiphenylsulfonium cation,
2-methyl-4-n-octyloxyphenyldiphenylsulfonium cation,
2-methyl-4-n-decyloxyphenyldiphenylsulfonium cation,
2-methyl-4-cyclohexyloxyphenyldiphenylsulfonium cation,
2-methyl-3-t-butoxyphenyldiphenylsulfonium cation,
2-methyl-4-t-butoxyphenyldiphenylsulfonium cation,
2-methyl-5-t-butoxyphenyldiphenylsulfonium cation,
2-methyl-6-t-butoxyphenyldiphenylsulfonium cation,
3-methyl-4-t-butoxyphenyldiphenylsulfonium cation,
3-methyl-5-t-butoxyphenyldiphenylsulfonium cation,
2-t-butoxy-3-methylphenyldiphenylsulfonium cation,
2-t-butoxy-4-methylphenyldiphenylsulfonium cation,
2-t-butoxy-5-methylphenyldiphenylsulfonium cation,
3-t-butoxy-4-methylphenyldiphenylsulfonium cation,
4-t-butoxy-2,6-dimethylphenyldiphenylsulfonium cation,
2-methyl-3-t-butoxycarbonylmethoxyphenyldiphenylsulfonium cation,
2-methyl-4-t-butoxycarbonylmethoxyphenyldiphenylsulfonium cation,
2-methyl-5-t-butoxycarbonylmethoxyphenyldiphenylsulfonium cation,
2-methyl-6-t-butoxycarbonylmethoxyphenyldiphenylsulfonium cation,
3-methyl-4-t-butoxycarbonylmethoxyphenyldiphenylsulfonium cation,
3-methyl-5-t-butoxycarbonylmethoxyphenyldiphenylsulfonium cation,
2-t-butoxycarbonylmethoxy-3-methylphenyldiphenylsulfonium cation,
2-t-butoxycarbonylmethoxy-4-methylphenyldiphenylsulfonium cation,
2-t-butoxycarbonylmethoxy-5-methylphenyldiphenylsulfonium cation,
3-t-butoxycarbonylmethoxy-4-methylphenyldiphenylsulfonium cation,
4-t-butoxycarbonylmethoxy-2,6-dimethylphenyldiphenylsulfonium cation,
2,3-dimethoxyphenyldiphenylsulfonium cation,
2,4-dimethoxyphenyldiphenylsulfonium cation,
2,5-dimethoxyphenyldiphenylsulfonium cation,
2,6-dimethoxyphenyldiphenylsulfonium cation,
3,4-dimethoxyphenyldiphenylsulfonium cation,
3,5-dimethoxyphenyldiphenylsulfonium cation,
2,4,6-trimethoxyphenyldiphenylsulfonium cation,
2-methoxy-3-t-butoxyphenyldiphenylsulfonium cation,
2-methoxy-4-t-butoxyphenyldiphenylsulfonium cation,
2-methoxy-5-t-butoxyphenyldiphenylsulfonium cation,
2-methoxy-6-t-butoxyphenyldiphenylsulfonium cation,
3-methoxy-4-t-butoxyphenyldiphenylsulfonium cation,
3-methoxy-5-t-butoxyphenyldiphenylsulfonium cation,
2-t-butoxy-3-methoxyphenyldiphenylsulfonium cation,
2-t-butoxy-4-methoxyphenyldiphenylsulfonium cation,
2-t-butoxy-5-methoxyphenyldiphenylsulfonium cation,
3-t-butoxy-4-methoxyphenyldiphenylsulfonium cation, 2,3-di-t-butoxyphenyldiphenylsulfonium cation,
2,4-di-t-butoxyphenyldiphenylsulfonium cation,
2,5-di-t-butoxyphenyldiphenylsulfonium cation,
2,6-di-t-butoxyphenyldiphenylsulfonium cation,
3,4-di-t-butoxyphenyldiphenylsulfonium cation,
3,5-di-t-but oxyphenyldiphenylsulfonium cation,
2,4,6-tri-t-butoxyphenyldiphenylsulfonium cation,
2-methoxy-3-t-butoxycarbonylmethoxyphenyldiphenylsulfonium cation,
2-methoxy-4-t-butoxycarbonylmethoxyphenyldiphenylsulfonium cation,
2-methoxy-5-t-butoxycarbonylmethoxyphenyldiphenylsulfonium cation,
2-methoxy-6-t-butoxycarbonylmethoxyphenyldiphenylsulfonium cation,
3-methoxy-4-t-butoxycarbonylmethoxyphenyldiphenylsulfonium cation,
3-methoxy-5-t-butoxycarbonylmethoxyphenyldiphenylsulfonium cation,
2-t-butoxycarbonylmethoxy-3-methoxyphenyldiphenylsulfonium cation,
2-t-butoxycarbonylmethoxy-4-methoxyphenyldiphenylsulfonium cation,
2-t-butoxycarbonylmethoxy-5-methoxyphenyldiphenylsulfonium cation,
3-t-butoxycarbonylmethoxy-4-methoxyphenyldiphenylsulfonium cation,
2-t-butoxy-3-t-butoxycarbonylmethoxyphenyldiphenylsulfonium cation,
2-t-butoxy-4-t-butoxycarbonylmethoxyphenyldiphenylsulfonium cation,
2-t-butoxy-5-t-butoxycarbonylmethoxyphenyldiphenylsulfonium cation,
2-t-butoxy-6-t-butoxycarbonylmethoxyphenyldiphenylsulfonium cation,
3-t-butoxy-4-t-butoxycarbonylmethoxyphenyldiphenylsulfonium cation,
3-t-butoxy-5-t-butoxycarbonylmethoxyphenyldiphenylsulfonium cation,
2-t-butoxycarbonylmethoxy-3-t-butoxyphenyldiphenylsulfonium cation,
2-t-butoxycarbonylmethoxy-4-t-butoxyphenyldiphenylsulfonium cation,
2-t-butoxycarbonylmethoxy-5-t-butoxyphenyldiphenylsulfonium cation,
3-t-butoxycarbonylmethoxy-4-t-butoxyphenyldiphenylsulfonium cation,
2,3-di-t-butoxycarbonylmethoxyphenyldiphenylsulfonium cation,
2,4-di-t-butoxycarbonylmethoxyphenyldiphenylsulfonium cation,
2,5-di-t-butoxymethoxyphenyldiphenylsulfonium cation,
2,6-di-t-butoxycarbonylmethoxyphenyldiphenylsulfonium cation,
3,4-di-t-butoxycarbonylmethoxyphenyldiphenylsulfonium cation,
3,5-di-t-butoxycarbonylmethoxyphenyldiphenylsulfonium cation,
2,4,6-tri-t-butoxycarbonylmethoxyphenyldiphenylsulfonium cation,
phenylbis(2,3-dimethylphenyl)sulfonium cation,
phenylbis(2,4-dimethylphenyl)sulfonium cation,
phenylbis(2,5-dimethylphenyl)sulfonium cation,
phenylbis(2,6-dimethylphenyl)sulfonium cation,
phenylbis(3,4-dimethylphenyl)sulfonium cation,
phenylbis(3,5-dimethylphenyl)sulfonium cation,
phenylbis(2,4,6-trimethylphenyl)sulfonium cation,
tris(2,3-dimethylphenyl)sulfonium cation,
tris(2,4-dimethylphenyl)sulfonium cation,
tris(2,5-dimethylphenyl)sulfonium cation,
tris(2,6-dimethylphenyl)sulfonium cation,
tris(3,4-dimethylphenyl)sulfonium cation,
tris(3,5-dimethylphenyl)sulfonium cation, and
tris(2,4,6-trimethylphenyl)sulfonium cation.

Of these sulfonium cations (a), the following compounds are preferable:
2,4-dihydroxyphenyldiphenylsulfonium cation,
2,4-dimethylphenyldiphenylsulfonium cation,
2,6-dimethylphenyldiphenylsulfonium cation,
2,4,6-trimethylphenyldiphenylsulfonium cation,
2,4,6-triethylphenyldiphenylsulfonium cation,
2,4,6-tri-i-propylphenyldiphenylsulfonium cation,
2,4-di-t-butoxyphenyldiphenylsulfonium cation,
2,4-di-t-butoxycarbonylmethoxyphenyldiphenylsulfonium cation,
4-t-butoxy-2,6-dimethylphenyldiphenylsulfonium cation, and
4-t-butoxycarbonylmethoxy-2,6-dimethylphenyldiphenylsulfonium cation.

In the formula (1-b), preferable groups represented by $R^{16}$ to $R^{20}$ are a fluorine atom and trifluoromethyl group, and the total number of the fluorine atom and trifluoromethyl group represented by $R^{16}$ to $R^{20}$ is 1–5.

The following compounds can be given as specific examples of the sulfonate anion (b):
2-fluorobenzenesulfonate anion,
3-fluorobenzenesulfonate anion,
4-fluorobenzenesulfonate anion,
2,3-difluorobenzenesulfonate anion,
2,4-difluorobenzenesulfonate anion,
2,5-difluorobenzenesulfonate anion,
2,6-difluorobenzenesulfonate anion,
3,2-difluorobenzenesulfonate anion,
3,5-difluorobenzenesulfonate anion,
2,4,6-trifluorobenzenesulfonate anion,
2,3,5,6-tetrafluorobenzenesulfonate anion,
2,3,4,5,6-pentafluorobenzenesulfonate anion,
2-fluoro-3-trifluoromethylbenzenesulfonate anion,
2-fluoro-4-trifluoromethylbenzenesulfonate anion,
2-fluoro-5-trifluoromethylbenzenesulfonate anion,
2-fluoro-6-trifluoromethylbenzenesulfonate anion,
3-fluoro-4-trifluoromethylbenzenesulfonate anion,
3-fluoro-5-trifluoromethylbenzenesulfonate anion,
2-trifluoromethyl-3-fluorobenzenesulfonate anion,
2-trifluoromethyl-4-fluorobenzenesulfonate anion,
2-trifluoromethyl-5-fluorobenzenesulfonate anion,
3-trifluoromethyl-4-fluorobenzenesulfonate anion,
2-trifluoromethylbenzenesulfonate anion,
3-trifluoromethylbenzenesulfonate anion,
4-trifluoromethylbenzenesulfonate anion,
2,3-bis(trifluoromethyl)benzenesulfonate anion,
2,4-bis(trifluoromethyl)benzenesulfonate anion,
2,5-bis(trifluoromethyl)benzenesulfonate anion,
2,6-bis(trifluoromethyl)benzenesulfonate anion,
3,4-bis(trifluoromethyl)benzenesulfonate anion,
3,5-bis(trifluoromethyl)benzenesulfonate anion,
2,4,6-tris(trifluoromethyl)benzenesulfonate anion,
2,3,5,6-tetrakis(trifluoromethyl)benzenesulfonate anion, and
2,3,4,5,6-pentakis(trifluoromethyl)benzenesulfonate anion.

Of these sulfonate anions (b), the following compounds are preferable:
4-fluorobenzenesulfonate anion,
2,4-difluorobenzenesulfonate anion,
2,6-difluorobenzenesulfonate anion, 2,3,4,5,6-pentafluorobenzenesulfonate anion,
4-trifluoromethylbenzenesulfonate anion,
2,4-bis(trifluoromethyl)benzenesulfonate anion,
2,4,6-tris(trifluoromethyl)benzenesulfonate anion, and
2,3,4,5,6-pentakis(trifluoromethyl)benzenesulfonate anion.

The following compounds can be given as examples of the acid generator (A) preferably used in the present invention:

2,4-dihydroxyphenyldiphenylsulfonium 4-fluorobenzenesulfonate,
2,4-dihydroxyphenyldiphenylsulfonium 2,4-difluorobenzenesulfonate,
2,4-dihydroxyphenyldiphenylsulfonium 2,6-difluorobenzenesulfonate,
2,4-dihydroxyphenyldiphenylsulfonium 2,3,4,5,6-pentafluorobenzenesulfonate,
2,4-dihydroxyphenyldiphenylsulfonium 4-trifluoromethylbenzenesulfonate,
2,4-dihydroxyphenyldiphenylsulfonium 2,4-bis(trifluoromethyl)benzenesulfonate,
2,4-dihydroxyphenyldiphenylsulfonium 2,4,6-tris(trifluoromethyl)benzenesulfonate,
2,4-dihydroxyphenyldiphenylsulfonium 2,3,4,5,6-pentakis(trifluoromethyl)benzenesulfonate,
2,4-dimethylphenyldiphenylsulfonium 4-fluorobenzenesulfonate,
2,4-dimethylphenyldiphenylsulfonium 2,4-difluorobenzenesulfonate,
2,4-dimethylphenyldiphenylsulfonium 2,6-difluorobenzenesulfonate,
2,4-dimethylphenyldiphenylsulfonium 2,3,4,5,6-pentafluorobenzenesulfonate,
2,4-dimethylphenyldiphenylsulfonium 4-trifluoromethylbenzenesulfonate,
2,4-dimethylphenyldiphenylsulfonium 2,4-bis(trifluoromethyl)benzenesulfonate,
2,4-dimethylphenyldiphenylsulfonium 2,4,6-tris(trifluoromethyl)benzenesulfonate,
2,4-dimethylphenyldiphenylsulfonium 2,3,4,5,6-pentakis(trifluoromethyl)benzenesulfonate,
2,6-dimethylphenyldiphenylsulfonium 4-fluorobenzenesulfonate,
2,6-dimethylphenyldiphenylsulfonium 2,4-difluorobenzenesulfonate,
2,6-dimethylphenyldiphenylsulfonium 2,6-difluorobenzenesulfonate,
2,6-dimethylphenyldiphenylsulfonium 2,3,4,5,6-pentafluorobenzenesulfonate,
2,6-dimethylphenyldiphenylsulfonium 4-trifluoromethylbenzenesulfonate,
2,6-dimethylphenyldiphenylsulfonium 2,4-bis(trifluoromethyl)benzenesulfonate,
2,6-dimethylphenyldiphenylsulfonium 2,4,6-tris(trifluoromethyl)benzenesulfonate,
2,6-dimethylphenyldiphenylsulfonium 2,3,4,5,6-pentakis(trifluoromethyl)benzenesulfonate,
3,5-dimethylphenyldiphenylsulfonium 4-fluorobenzenesulfonate,
3,5-dimethylphenyldiphenylsulfonium 2,4-difluorobenzenesulfonate,
3,5-dimethylphenyldiphenylsulfonium 2,6-difluorobenzenesulfonate,
3,5-dimethylphenyldiphenylsulfonium 2,3,4,5,6-pentafluorobenzenesulfonate,
3,5-dimethylphenyldiphenylsulfonium 4-trifluoromethylbenzenesulfonate,
3,5-dimethylphenyldiphenylsulfonium 2,4-bis(trifluoromethyl)benzenesulfonate,
3,5-dimethylphenyldiphenylsulfonium 2,4,6-tris(trifluoromethyl)benzenesulfonate,
3,5-dimethylphenyldiphenylsulfonium 2,3,4,5,6-pentakis(trifluoromethyl)benzenesulfonate,
2,4,6-trimethylphenyldiphenylsulfonium 4-fluorobenzenesulfonate,
2,4,6-trimethylphenyldiphenylsulfonium 2,4-difluorobenzenesulfonate,
2,4,6-trimethylphenyldiphenylsulfonium 2,6-difluorobenzenesulfonate,
2,4,6-trimethylphenyldiphenylsulfonium 2,3,4,5,6-pentafluorobenzenesulfonate,
2,4,6-trimethylphenyldiphenylsulfonium 4-trifluoromethylbenzenesulfonate,
2,4,6-trimethylphenyldiphenylsulfonium 2,4-bis(trifluoromethyl)benzenesulfonate,
2,4,6-trimethylphenyldiphenylsulfonium 2,4,6-tris(trifluoromethyl)benzenesulfonate,
2,4,6-trimethylphenyldiphenylsulfonium 2,3,4,5,6-pentakis(trifluoromethyl)benzenesulfonate,
2,4,6-triethylphenyldiphenylsulfonium 4-fluorobenzenesulfonate,
2,4,6-triethylphenyldiphenylsulfonium 2,4-difluorobenzenesulfonate,
2,4,6-triethylphenyldiphenylsulfonium 2,6-difluorobenzenesulfonate,
2,4,6-triethylphenyldiphenylsulfonium 2,3,4,5,6-pentafluorobenzenesulfonate,
2,4,6-triethylphenyldiphenylsulfonium 4-trifluoromethylbenzenesulfonate,
2,4,6-triethylphenyldiphenylsulfonium 2,4-bis(trifluoromethyl)benzenesulfonate,
2,4,6-triethylphenyldiphenylsulfonium 2,4,6-tris(trifluoromethyl)benzenesulfonate,
2,4,6-triethylphenyldiphenylsulfonium 2,3,4,5,6-pentakis(trifluoromethyl)benzenesulfonate,
2,4,6-tri-i-propylphenyldiphenyl sulfonium 4-fluorobenzenesulfonate,
2,4,6-tri-i-propylphenyldiphenyl sulfonium 2,4-difluorobenzenesulfonate,
2,4,6-tri-i-propylphenyldiphenyl sulfonium 2,6-difluorobenzenesulfonate,
2,4,6-tri-i-propylphenyldiphenylsulfonium 2,3,4,5,6-pentafluorobenzenesulfonate,
2,4,6-tri-i-propylphenyldiphenyl sulfonium 4-trifluoromethylbenzenesulfonate,
2,4,6-tri-i-propylphenyldiphenylsulfonium 2,4-bis(trifluoromethyl)benzenesulfonate,
2,4,6-tri-i-propylphenyldiphenylsulfonium 2,4,6-tris(trifluoromethyl)benzenesulfonate,
2,4,6-tri-i-propylphenyldiphenylsulfonium 2,3,4,5,6-pentakis(trifluoromethyl)benzenesulfonate,
2,4-di-t-butoxyphenyldiphenylsulfonium 4-fluorobenzenesulfonate,
2,4-di-t-butoxyphenyldiphenylsulfonium 2,4-difluorobenzenesulfonate,
2,4-di-t-butoxyphenyldiphenylsulfonium 2,6-difluorobenzenesulfonate,
2,4-di-t-butoxyphenyldiphenylsulfonium 2,3,4,5,6-pentafluorobenzenesulfonate,
2,4-di-t-butoxyphenyldiphenylsulfonium 4-trifluoromethylbenzenesulfonate,
2,4-di-t-butoxyphenyldiphenylsulfonium 2,4-bis(trifluoromethyl)benzenesulfonate,
2,4-di-t-butoxyphenyldiphenylsulfonium 2,4,6-tris(trifluoromethyl)benzenesulfonate,
2,4-di-t-butoxyphenyldiphenylsulfonium 2,3,4,5,6-pentakis(trifluoromethyl)benzenesulfonate, 2,6-di-t-butoxyphenyldiphenylsulfonium 4-fluorobenzenesulfonate,
2,6-di-t-butoxyphenyldiphenylsulfonium 2,4-difluorobenzenesulfonate,
2,6-di-t-butoxyphenyldiphenylsulfonium 2,6-difluorobenzenesulfonate,
2,6-di-t-butoxyphenyldiphenylsulfonium 2,3,4,5,6-pentafluorobenzenesulfonate,
2,6-di-t-butoxyphenyldiphenylsulfonium 4-trifluoromethylbenzenesulfonate,
2,6-di-t-butoxyphenyldiphenylsulfonium 2,4-bis(trifluoromethyl)benzenesulfonate,
2,6-di-t-butoxyphenyldiphenylsulfonium 2,4,6-tris(trifluoromethyl)benzenesulfonate,
2,6-di-t-butoxyphenyldiphenylsulfonium 2,3,4,5,6-pentakis(trifluoromethyl)benzenesulfonate,
3,5-di-t-butoxyphenyldiphenylsulfonium 4-fluorobenzenesulfonate,
3,5-di-t-butoxyphenyldiphenylsulfonium 2,4-difluorobenzenesulfonate,
3,5-di-t-butoxyphenyldiphenylsulfonium 2,6-difluorobenzenesulfonate,
3,5-di-t-butoxyphenyldiphenylsulfonium 2,3,4,5,6-pentafluorobenzenesulfonate,
3,5-di-t-butoxyphenyldiphenylsulfonium 4-trifluoromethylbenzenesulfonate,
3,5-di-t-butoxyphenyldiphenylsulfonium 2,4-bis(trifluoromethyl)benzenesulfonate,
3,5-di-t-butoxyphenyldiphenylsulfonium 2,4,6-tris(trifluoromethyl)benzenesulfonate,
3,5-di-t-butoxyphenyldiphenylsulfonium 2,3,4,5,6-pentakis(trifluoromethyl)benzenesulfonate,
2,4,6-tri-t-butoxyphenyldiphenylsulfonium 4-fluorobenzenesulfonate,
2,4,6-tri-t-butoxyphenyldiphenylsulfonium 2,4-difluorobenzenesulfonate,
2,4,6-tri-t-butoxyphenyldiphenylsulfonium 2,6-difluorobenzenesulfonate,
2,4,6-tri-t-butoxyphenyldiphenylsulfonium 2,3,4,5,6-pentafluorobenzenesulfonate,
2,4,6-tri-t-butoxyphenyldiphenylsulfonium 4-trifluoromethylbenzenesulfonate,
2,4,6-tri-t-butoxyphenyldiphenylsulfonium 2,4-bis(trifluoromethyl)benzenesulfonate,
2,4,6-tri-t-butoxyphenyldiphenylsulfonium 2,4,6-tris(trifluoromethyl)benzenesulfonate,
2,4,6-tri-t-butoxyphenyldiphenylsulfonium 2,3,4,5,6-pentakis(trifluoromethyl)benzenesulfonate,
2,4-di-t-butoxycarbonylmethoxyphenyldiphenylsulfonium 4-fluorobenzenesulfonate,
2,4-di-t-butoxycarbonylmethoxyphenyldiphenylsulfonium 2,4-difluorobenzenesulfonate,
2,4-di-t-butoxycarbonylmethoxyphenyldiphenylsulfonium 2,6-difluorobenzenesulfonate,
2,4-di-t-butoxycarbonylmethoxyphenyldiphenylsulfonium 2,3,4,5,6-pentafluorobenzenesulfonate,
2,4-di-t-butoxycarbonylmethoxyphenyldiphenylsulfonium 4-trifluoromethylbenzenesulfonate,
2,4-di-t-butoxycarbonylmethoxyphenyldiphenylsulfonium 2,4-bis(trifluoromethyl)benzenesulfonate,
2,4-di-t-butoxycarbonylmethoxyphenyldiphenylsulfonium 2,4,6-tris(trifluoromethyl)benzenesulfonate,
2,4-di-t-butoxycarbonylmethoxyphenyldiphenylsulfonium 2,3,4,5,6-pentakis(trifluoromethyl)benzenesulfonate,
2,6-di-t-butoxycarbonylmethoxyphenyldiphenylsulfonium 4-fluorobenzenesulfonate,
2,6-di-t-butoxycarbonylmethoxyphenyldiphenylsulfonium 2,4-difluorobenzenesulfonate,
2,6-di-t-butoxycarbonylmethoxyphenyldiphenylsulfonium 2,6-difluorobenzenesulfonate,
2,6-di-t-butoxycarbonylmethoxyphenyldiphenylsulfonium 2,3,4,5,6-pentafluorobenzenesulfonate,
2,6-di-t-butoxycarbonylmethoxyphenyldiphenylsulfonium 4-trifluoromethylbenzenesulfonate,
2,6-di-t-butoxycarbonylmethoxyphenyldiphenylsulfonium 2,4-bis(trifluoromethyl)benzenesulfonate,
2,6-di-t-butoxycarbonylmethoxyphenyldiphenylsulfonium 2,4,6-tris(trifluoromethyl)benzenesulfonate,
2,6-di-t-butoxycarbonylmethoxyphenyldiphenylsulfonium 2,3,4,5,6-pentakis(trifluoromethyl)benzenesulfonate,
3,5-di-t-butoxycarbonylmethoxyphenyldiphenylsulfonium 4-fluorobenzenesulfonate,
3,5-di-t-butoxycarbonylmethoxyphenyldiphenylsulfonium 2,4-difluorobenzenesulfonate,
3,5-di-t-butoxycarbonylmethoxyphenyldiphenylsulfonium 2,6-difluorobenzenesulfonate,
3,5-di-t-butoxycarbonylmethoxyphenyldiphenylsulfonium 2,3,4,5,6-pentafluorobenzenesulfonate,
3,5-di-t-butoxycarbonylmethoxyphenyldiphenylsulfonium 4-trifluoromethylbenzenesulfonate,
3,5-di-t-butoxycarbonylmethoxyphenyldiphenylsulfonium 2,4-bis(trifluoromethyl)benzenesulfonate,
3,5-di-t-butoxycarbonylmethoxyphenyldiphenylsulfonium 2,4,6-tris(trifluoromethyl)benzenesulfonate,
3,5-di-t-butoxycarbonylmethoxyphenyldiphenylsulfonium 2,3,4,5,6-pentakis(trifluoromethyl)benzenesulfonate,
2,4,6-tri-t-butoxycarbonylmethoxyphenyldiphenylsulfonium 4-fluorobenzenesulfonate,
2,4,6-tri-t-butoxycarbonylmethoxyphenyldiphenylsulfonium 2,4-difluorobenzenesulfonate,
2,4,6-tri-t-butoxycarbonylmethoxyphenyldiphenylsulfonium 2,6-difluorobenzenesulfonate,
2,4,6-tri-t-butoxycarbonylmethoxyphenyldiphenylsulfonium 2,3,4,5,6-pentafluorobenzenesulfonate,
2,4,6-tri-t-butoxycarbonylmethoxyphenyldiphenylsulfonium 4-trifluoromethylbenzenesulfonate,
2,4,6-tri-t-butoxycarbonylmethoxyphenyldiphenylsulfonium 2,4-bis(trifluoromethyl)benzenesulfonate,
2,4,6-tri-t-butoxycarbonylmethoxyphenyldiphenylsulfonium 2,4,6-tris(trifluoromethyl)benzenesulfonate,
2,4,6-tri-t-butoxycarbonylmethoxyphenyldiphenylsulfonium 2,3,4,5,6-pentakis(trifluoromethyl)benzenesulfonate,
4-t-butoxy-2,6-dimethylphenyldiphenylsulfonium 4-fluorobenzenesulfonate,
4-t-butoxy-2,6-dimethylphenyldiphenylsulfonium 2,4-difluorobenzenesulfonate,
4-t-butoxy-2,6-dimethylphenyldiphenylsulfonium 2,6-difluorobenzenesulfonate,
4-t-butoxy-2,6-dimethylphenyldiphenylsulfonium 2,3,4,5,6-pentafluorobenzenesulfonate,
4-t-butoxy-2,6-dimethylphenyldiphenylsulfonium 4-trifluoromethylbenzenesulfonate,
4-t-butoxy-2,6-dimethylphenyldiphenylsulfonium 2,4-bis(trifluoromethyl)benzenesulfonate,
4-t-butoxy-2,6-dimethylphenyldiphenylsulfonium 2,4,6-tris(trifluoromethyl)benzenesulfonate,
4-t-butoxy-2,6-dimethylphenyldiphenylsulfonium 2,3,4,5,6-pentakis(trifluoromethyl)benzenesulfonate, 4-t-butoxycarbonylmethoxy-2,6-dimethylphenyldiphenyl-sulfonium 4-fluorobenzenesulfonate,
4-t-butoxycarbonylmethoxy-2,6-dimethylphenyldiphenyl-sulfonium 2,4-difluorobenzenesulfonate,
4-t-butoxycarbonylmethoxy-2,6-dimethylphenyldiphenyl-sulfonium 2,6-difluorobenzenesulfonate,
4-t-butoxycarbonylmethoxy-2,6-dimethylphenyldiphenyl-sulfonium 2,3,4,5,6-pentafluorobenzenesulfonate,
4-t-butoxycarbonylmethoxy-2,6-dimethylphenyldiphenyl-sulfonium 4-trifluoromethylbenzenesulfonate,
4-t-butoxycarbonylmethoxy-2,6-dimethylphenyldiphenyl-sulfonium 2,4-bis(trifluoromethyl)benzenesulfonate,
4-t-butoxycarbonylmethoxy-2,6-dimethylphenyldiphenyl-sulfonium 2,4,6-tris(trifluoromethyl)benzenesulfonate,
and 4-t-butoxycarbonylmethoxy-2,6-dimethylphenyldiphenylsulfonium, and
2,3,4,5,6-pentakis(trifluoromethyl)benzenesulfonate.

Of these acid generators (A), the following compounds are particularly preferable:
2,4-dihydroxyphenyldiphenylsulfonium 2,4,6-tris(trifluoromethyl)benzenesulfonate,
2,4-dimethylphenyldiphenylsulfonium 2,3,4,5,6-pentakis(trifluoromethyl)benzenesulfonate,
2,4,6-trimethylphenyldiphenylsulfonium 2,4-difluorobenzenesulfonate,
2,4,6-trimethylphenyldiphenylsulfonium 4-trifluoromethylbenzenesulfonate,
2,4,6-triethylphenyldiphenylsulfonium 4-trifluoromethylbenzenesulfonate,
2,4,6-tri-i-propylphenyldiphenyl sulfonium 2,4-difluorobenzenesulfonate,
4-t-butoxy-2,6-dimethylphenyldiphenylsulfonium 2,3,4,5,6-pentafluorobenzenesulfonate,
and 4-t-butoxycarbonylmethoxy-2,6-dimethylphenyldiphenylsulfonium 2,4,6-tris(trifluoromethyl)benzenesulfonate.

Other Acid Generators

In the present invention, the following photoacid generators (hereinafter referred to as "other acid generators") can optionally be used in combination with the acid generator (A).

As examples of the other acid generators, (1) onium salt compounds, (2) sulfone compounds, (3) sulfonate compounds, (4) sulfonimide compounds, (5) diazomethane compounds, (6) oxime sulfonate compounds, and the like can be given. These other acid generators will now be described in detail.

(1) Onium Salt Compounds

As examples of onium salt compounds, iodonium salt, sulfonium salt, phosphonium salt, diazonium salt, ammonium salt, pyridinium salt, and the like can be given.

Specific examples of onium salts include:
bis(p-t-butylphenyl)iodoniumtrifluoromethane sulfonate,
bis(p-t-butylphenyl)iodonium nonafluoro-n-butanesulfonate,
bis(p-t-butylphenyl)iodonium o-trifluoromethylbenzenesulfonate,
bis(p-t-butylphenyl)iodonium p-trifluoromethylbenzenesulfonate,
bis(p-t-butylphenyl)iodonium 10-camphorsulfonate,
bis(p-t-butylphenyl)iodonium p-toluenesulfonate,
bis(p-t-butylphenyl)iodonium pyrenesulfonate,
bis(p-t-butylphenyl)iodonium n-dodecylbenzenesulfonate,
bis(p-t-butylphenyl)iodonium benzenesulfonate,
bis(p-t-butylphenyl)iodonium 2,4-difluorobenzenesulfonate,
bis(p-t-butylphenyl)iodonium n-octanesulfonate,
diphenyliodonium trifluoromethanesulfonate,
diphenyliodonium nonafluoro-n-butanesulfonate,
diphenyliodonium o-trifluoromethylbenzenesulfonate,
diphenyliodonium p-trifluoromethylbenzenesulfonate,
diphenyliodonium 10-camphorsulfonate,
diphenyliodonium p-toluenesulfonate,
diphenyliodonium pyrenesulfonate,
diphenyliodonium n-dodecylbenzenesulfonate,
diphenyliodonium benzenesulfonate,
triphenylsulfonium 2,4-difluorobenzenesulfonate,
diphenyliodonium n-oactanesulfonate,
triphenylsulfonium trifluoromethanesulfonate,
triphenylsulfonium nonafluoro-n-butanesulfonate,
triphenylsulfonium o-trifluoromethylbenzenesulfonate,
triphenylsulfonium p-trifluoromethylbenzenesulfonate,
triphenylsulfonium 10-camphorsulfonate,
triphenylsulfonium p-toluenesulfonate,
triphenylsulfonium pyrenesulfonate,
triphenylsulfonium n-dodecylbenzenesulfonate,
triphenylsulfonium benzenesulfonate,
triphenylsulfonium 2,4-difluorobenzenesulfonate,
triphenylsulfonium n-oactanesulfonate,
p-methylphenyldiphenylsulfonium trifluoromethanesulfonate,
p-methylphenyldiphenylsulfonium nonafluoro-n-butanesulfonate,
p-methylphenyldiphenylsulfonium o-trifluoromethylbenzenesulfonate,
p-methylphenyldiphenylsulfonium p-trifluoromethylbenzenesulfonate,
p-methylphenyldiphenylsulfonium 10-camphorsulfonate,
p-methylphenyldiphenylsulfonium p-toluenesulfonate,
p-methylphenyldiphenylsulfonium pyrenesulfonate,
p-methylphenyldiphenylsulfonium n-dodecylbenzenesulfonate,
p-methylphenyldiphenylsulfonium benzenesulfonate,
p-methylphenyldiphenylsulfonium 2,4-difluorobenzenesulfonate,
p-methylphenyldiphenylsulfonium n-octanesulfonate,
p-ethylphenyldiphenylsulfonium trifluoromethanesulfonate,
p-ethylphenyldiphenylsulfonium nonafluoro-n-butanesulfonate,
p-ethylphenyldiphenylsulfonium o-trifluoromethylbenzenesulfonate,
p-ethylphenyldiphenylsulfonium p-trifluoromethylbenzenesulfonate,
p-ethylphenyldiphenylsulfonium 10-camphorsulfonate,
p-ethylphenyldiphenylsulfonium p-toluenesulfonate,
p-ethylphenyldiphenylsulfonium pyrenesulfonate,
p-ethylphenyldiphenylsulfonium n-dodecylbenzenesulfonate,
p-ethylphenyldiphenylsulfonium benzenesulfonate,
p-ethylphenyldiphenylsulfonium 2,4-difluorobenzenesulfonate,
p-ethylphenyldiphenylsulfonium n-octanesulfonate,
p-i-propylphenyldiphenylsulfonium trifluoromethanesulfonate,
p-i-propylphenyldiphenylsulfonium nonafluoro-n-butanesulfonate,
p-i-propylphenyldiphenylsulfonium o-trifluoromethylbenzenesulfonate,
p-i-propylphenyldiphenylsulfonium p-trifluoromethylbenzenesulfonate,
p-i-propylphenyldiphenylsulfonium 10-camphorsulfonate,
p-i-propylphenyldiphenylsulfonium p-toluenesulfonate,
p-i-propylphenyldiphenylsulfonium pyrenesulfonate,
p-i-propylphenyldiphenylsulfonium n-dodecylbenzenesulfonate, p-i-propylphenyldiphenylsulfonium benzenesulfonate,
p-i-propylphenyldiphenylsulfonium 2,4-difluorobenzenesulfonate,
p-i-propylphenyldiphenylsulfonium n-octanesulfonate,
p-t-butylphenyldiphenylsulfonium trifluoromethanesulfonate,
p-t-butylphenyldiphenylsulfonium nonafluoro-n-butanesulfonate,
p-t-butylphenyldiphenylsulfonium o-trifluoromethylbenzenesulfonate,
p-t-butylphenyldiphenylsulfonium p-trifluoromethylbenzenesulfonate,
p-t-butylphenyldiphenylsulfonium 10-camphorsulfonate,
p-t-butylphenyldiphenylsulfonium p-toluenesulfonate,
p-t-butylphenyldiphenylsulfonium pyrenesulfonate,
p-t-butylphenyldiphenylsulfonium n-dodecylbenzenesulfonate,
p-t-butylphenyldiphenylsulfonium benzenesulfonate,
p-t-butylphenyldiphenylsulfonium 2,4-difluorobenzenesulfonate,
p-t-butylphenyldiphenylsulfonium n-octanesulfonate,
p-methoxyphenyldiphenylsulfonium trifluoromethanesulfonate,
p-methoxyphenyldiphenylsulfonium nonafluoro-n-butanesulfonate,
p-methoxyphenyldiphenylsulfonium o-trifluoromethylbenzenesulfonate,
p-methoxyphenyldiphenylsulfonium p-trifluoromethylbenzenesulfonate,
p-methoxyphenyldiphenylsulfonium 10-camphorsulfonate,
p-methoxyphenyldiphenylsulfonium p-toluenesulfonate,
p-methoxyphenyldiphenylsulfonium pyrenesulfonate,
p-methoxyphenyldiphenylsulfonium n-dodecylbenzenesulfonate,
p-methoxyphenyldiphenylsulfonium benzenesulfonate,
p-methoxyphenyldiphenylsulfonium 2,4-difluorobenzenesulfonate,
p-methoxyphenyldiphenylsulfonium n-octanesulfonate,
p-t-butoxyphenyldiphenylsulfonium trifluoromethanesulfonate,
p-t-butoxyphenyldiphenylsulfonium nonafluoro-n-butanesulfonate,
p-t-butoxyphenyldiphenylsulfonium o-trifluoromethylbenzenesulfonate,
p-t-butoxyphenyldiphenylsulfonium p-trifluoromethylbenzenesulfonate,
p-t-butoxyphenyldiphenylsulfonium 10-camphorsulfonate,
p-t-butoxyphenyldiphenylsulfonium p-toluenesulfonate,
p-t-butoxyphenyldiphenylsulfonium pyrenesulfonate,
p-t-butoxyphenyldiphenylsulfonium n-dodecylbenzenesulfonate,
p-t-butoxyphenyldiphenylsulfonium benzenesulfonate,
p-t-butoxyphenyldiphenylsulfonium 2,4-difluorobenzenesulfonate,
p-t-butoxyphenyldiphenylsulfonium n-octanesulfonate,
p-t-butoxycarbonylmethoxyphenyldiphenylsulfonium trifluoromethanesulfonate,
p-t-butoxycarbonylmethoxyphenyldiphenylsulfonium nonafluoro-n-butanesulfonate,
p-t-butoxycarbonylmethoxyphenyldiphenylsulfonium o-trifluoromethylbenzenesulfonate,
p-t-butoxycarbonylmethoxyphenyldiphenylsulfonium p-trifluoromethylbenzenesulfonate,
p-t-butoxycarbonylmethoxyphenyldiphenylsulfonium 10-camphorsulfonate,
p-t-butoxycarbonylmethoxyphenyldiphenylsulfonium p-toluenesulfonate,
p-t-butoxycarbonylmethoxyphenyldiphenylsulfonium pyrenesulfonate,
p-t-butoxycarbonylmethoxyphenyldiphenylsulfonium n-dodecylbenzenesulfonate,
p-t-butoxycarbonylmethoxyphenyldiphenylsulfonium benzenesulfonate,
p-t-butoxycarbonylmethoxyphenyldiphenylsulfonium 2,4-difluorobenzenesulfonate, and
and p-t-butoxycarbonylmethoxyphenyldiphenylsulfonium n-octanesulfonate, (2) Sulfone Compounds As examples of sulfone compounds, β-ketosulfone, β-sulfonylsulfone, and the like can be given.

As specific examples of sulfone compounds, phenacylphenylsulfone, mesitylphenacylsulfone, bis(phenylsulfonyl)methane, 1,1-bis(phenylsulfonyl)cyclopentane, 1,1-bis(phenylsulfonyl)cyclohexane, 4-trisphenacylsulfone, and the like can be given.

(3) Sulfonate Compounds

As examples of sulfonate compounds, alkyl sulfonate, haloalkyl sulfonate, aryl sulfonate, imino sulfonate, and the like can be given.

As specific examples of sulfonate compounds, benzointosylate, pyrogallol tristrifluoromethanesulfonate, pyrogallol methanetrisulfonate, nitrobenzyl-9,10-diethoxyanthracene-2-sulfonate, α-methylolbenzointosylate, α-methylolbenzoin n-octanesulfonate, α-methylolbenzoin n-dodecanesulfonate, α-methylolbenzoin trifluoromethanesulfonate, and the like can be given.

(4) Sulfonimide Compounds

As examples of sulfonimide compounds, compounds shown by the following formula (4) can be given:

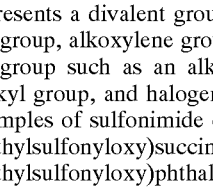

(4)

wherein X represents a divalent group such as an alkylene group, arylene group, alkoxylene group, and $R^{23}$ represents a monovalent group such as an alkyl group, aryl group, halogenated alkyl group, and halogenated aryl group.

Specific examples of sulfonimide compounds include:
N-(trifluoromethylsulfonyloxy)succinimide,
N-(trifluoromethylsulfonyloxy)phthalimide,
N-(trifluoromethylsulfonyloxy)diphenylmaleimide,
N-(trifluoromethylsulfonyloxy)bicyclo[2.2.1]hept-5-ene-2,3-dicarboxyimide,
N-(trifluoromethylsulfonyloxy)-7-oxabicyclo[2.2.1]hept-5-ene-2,3-dicarboxyimide,
N-(trifluoromethylsulfonyloxy)bicyclo[2.2.1]heptan-5,6-oxy-2,3-dicarboxyimide,
N-(trifluoromethylsulfonyloxy)naphthylimide,
N-(10-camphorsulfonyloxy)succinimide,
N-(10-camphorsulfonyloxy)phthalimide,
N-(10-camphorsulfonyloxy)diphenylmaleimide,
N-(10-camphorsulfonyloxy)bicyclo[2.2.1]hept-5-ene-2,3-dicarboxyimide,
N-(10-camphorsulfonyloxy)-7-oxabicyclo[2.2.1]hept-5-ene-2,3-dicarboxyimide,
N-(10-camphorsulfonyloxy)bicyclo[2.2.1]heptan-5,6-oxy-2,3-dicarboxyimide,
N-(10-camphorsulfonyloxy)naphthylimide,
N-(p-methylphenylsulfonyloxy)succinimide, N-(p-methylphenylsulfonyloxy)phthalimide,
N-(p-methylphenylsulfonyloxy)diphenylmaleimide,
N-(p-methylphenylsulfonyloxy)bicyclo[2.2.1]hept-5-ene-2,3-dicarboxyimide,
N-(p-methylphenylsulfonyloxy)-7-oxabicyclo[2.2.1]hept-5-ene-2,3-dicarboxyimide,
N-(p-methylphenylsulfonyloxy)bicyclo[2.2.1]heptane-5,6-oxy-2,3-dicarboxyimide,
N-(p-methylphenylsulfonyloxy)naphthylimide,
N-(o-trifluoromethylphenylsulfonyloxy)succinimide,
N-(o-trifluoroethylphenylsulfonyloxy)phthalimide,
N-(o-trifluoromethylphenylsulfonyloxy)diphenylmaleimide,
N-(o-trifluoromethylphenylsulfonyloxy)bicyclo[2.2.1]hept-5-ene-2,3-dicarboxyimido,
N-(o-trifluoromethylphenylsulfonyloxy)-7-oxabicyclo-[2.2.1]hept-5-ene-2,3-dicarboxyimide,
N-(o-trifluoromethylphenylsulfonyloxy)bicyclo[2.2.1]-heptane-5, 6-oxy-2,3-dicarboxyimide,
N-(o-trifluoromethylphenylsulfonyloxy)naphthylimide,
N-(p-fluorophenylsulfonyloxy)succinimide,
N-(p-fluorophenylsulfonyloxy)phthalimide,
N-(p-fluorophenylsulfonyloxy)diphenylmaleimide,
N-(p-fluorophenylsulfonyloxy)bicyclo[2.2.1]hept-5-ene-2,3-dicarboxyimide,
N-(p-fluorophenylsulfonyloxy)-7-oxabicyclo[2.2.1]hept-5-ene-2,3-dicarboxyimide,
N-(p-fluorophenylsulfonyloxy)bicyclo[2.2.1]heptane-5,6-oxy-2,3-dicarboxyimide, and
N-(p-fluorophenylsulfonyloxy)naphthylimide.

(5) Diazomethane Compounds

As examples of diazomethane compounds, compounds shown by the following formula (5) can be given:

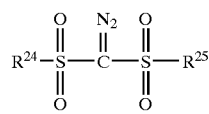

(5)

wherein $R^{24}$ and $R^{25}$ individually represent a substituted or unsubstituted, linear, branched, or cyclic alkyl group having 1–20 carbon atoms, a substituted or unsubstituted aryl group having 6–20 carbon atoms, a substituted or unsubstituted aralkyl group having 7–20 carbon atoms, or other monovalent organic groups having a hetero-atom and 1–20 carbon atoms.

Specific examples of diazomethane compounds include:
bis(trifluoromethylsulfonyl)diazomethane,
bis(t-butylsulfonyl)diazomethane,
bis(cyclohexylsulfonyl)diazomethane,
bis(phenylsulfonyl)diazomethane,
bis(p-methylphenylsulfonyl)diazomethane,
bis(1,4-dioxaspiro[4.5]decane-7-sulfonyl)diazomethane,
bis(1,5-dioxaspiro[5.5]undecane-8-sulfonyl)diazomethane,
bis(3,3-dimethyl-1,5-dioxaspiro[5.5]undecane-8-sulfonyl)diazomethane,
methylsulfonyl.cyclohexylsulfonyldiazomethane,
methylsulfonyl.phenylsulfonyldiazomethane,
methylsulfonyl.p-methylphenylsulfonyldiazomethane,
t-butylsulfonyl.cyclohexylsulfonyldiazomethane,
t-butylsulfonyl.phenylsulfonyldiazomethane,
t-butylsulfonyl.p-methylphenylsulfonyldiazomethane,
cyclohexylsulfonyl.1,4-dioxaspiro[4.5]decane-7-sulfonyldiazomethane,
cyclohexylsulfonyl.1,5-dioxaspiro[5.5]undecane-8-sulfonyldiazomethane, and
cyclohexylsulfonyl.3,3-dimethyl-1,5-dioxaspiro[5.5]undecane-8-sulfonyldiazomethane.

(6) Oxime Sulfonate Compounds

The following compounds can be given as examples of oxime sulfonate compounds:
(5-n-propylsulfonyloxyimino-5H-thiophene-2-indene)-(2-methylphenynone)acetonitrile,
2,2,2-trifluoro-1-{4-(3-[4-{2,2,2-trifluoro-1-(1-n-propane-sulfonyloxyimino)ethyl}phenoxy]n-propoxy)phenyl}ethaneoxime 1-n-propanesulfonate, and the like.

These other acid generators may be used either individually or in combination of two or more.

(B) Resin

The component (B) of the present invention is a resin (hereinafter referred to as "resin (B)") having the recurring unit represented by the above formula (2) (hereinafter referred to as "recurring unit (2)") and the recurring unit represented by the above formula (3) (hereinafter referred to as "recurring unit (3)").

As examples of a linear, branched, or cyclic alkyl group having 1–6 carbon atoms represented by $R^{22}$ in the formula (2), a methyl group, ethyl group, n-propyl group, i-propyl group, n-butyl group, i-butyl group, sec-butyl group, t-butyl group, n-pentyl group, neopentyl group, n-hexyl group, cyclopentyl group, cyclohexyl group, and the like can be given.

Preferable groups for $R^{22}$ in the formula (2) are a methyl group, ethyl group, cyclohexyl group, and the like.

A methyl group and an ethyl group are preferable groups for $R^{21}$ in the formula (2).

The group —OCH($R^{21}$)(O$R^{22}$) in the formula (2) forms an acetal structure together with the benzene ring in the formula (2), which dissociates in the presence of an acid.

As specific examples of the recurring unit (2), groups obtained by cleavage of a polymerizable unsaturated bond in the compound such as a p-(1-methoxyethoxy)styrene, p-(1-ethoxyethoxy)styrene, p-(1-n-propoxyethoxy)styrene, p-(1-i-propoxyethoxy)styrene, p-(1-n-butoxyethoxy)styrene, p-(1-t-butoxyethoxy)styrene, p-(1-n-pentyloxyethoxy) styrene, p-(1-neopentyloxyethoxy)styrene, p-(1-n-hexyloxyethoxy)styrene, p-(1-cyclopentyloxyethoxy)styrene, p-(1-cyclohexyloxyethoxy)styrene, p-(1-methoxypropoxy)styrene, p-(1-ethoxypropoxy)styrene, p-(1-n-propoxypropoxy)styrene, p-(1-i-propoxypropoxy) styrene, p-(1-n-butoxypropoxy)styrene, p-(1-t-butoxypropoxy)styrene, p-(1-n-pentyloxypropoxy)styrene, p-(1-neopentyloxypropoxy)styrene, p-(1-n-hexyloxypropoxy)styrene, p-(1-cyclopentyloxypropoxy) styrene, p-(1-cyclohexyloxypropoxy)styrene, or the like can be given.

Of these the recurring units (2), groups obtained by cleavage of a polymerizable unsaturated bond in the compound such as a p-(1-methoxyethoxy)styrene, p-(1-ethoxyethoxy)styrene, p-(1-methoxypropoxy)styrene, p-(1-ethoxypropoxy)styrene, p-(1-cyclohexyloxyethoxy) styrene, or the like are preferable.

The recurring units (2) may be used in the resin (B) either individually or in combination of two or more.

The resin (B) may further contain other recurring units and may have a structure partially crosslinked by a suitable cross-linking group (for example, a cross-linking group having a diethylene glycol skeleton).

Given as examples of such other recurring units are groups obtained by cleavage of a polymerizable unsaturated bond in the following compounds: vinyl aromatic compounds such as styrene, α-methylstyrene, o-methylstyrene, m-methylstyrene, p-methylstyrene, o-methoxystyrene, m-methoxystyrene, p-methoxystyrene, p-t-butoxystyrene, p-t-butoxycarbonyloxystyrene, p-t-butoxycarbonylmethyloxystyrene, p-(2-t-butoxycarbonylethyloxy)styrene, o-hydroxystyrene, m-hydroxy-styrene, 3,4-dihydroxystyrene, p-hydroxy-α-methylstyrene, p-acetoxystyrene, p-tetrahydrofuranyloxystyrene, and p-tetrahydropyranyloxystyrene; (meth)acrylatic acid esters such as methyl (meth)acrylate, ethyl (meth)acrylate, n-propyl (meth)acrylate, n-butyl (meth)acrylate, i-butyl (meth)acrylate, sec-butyl (meth)acrylate, t-butyl (meth) acrylate, n-pentyl (meth)acrylate, neopentyl (meth)acrylate, n-hexyl (meth)acrylate, 2-ethylhexyl (meth)acrylate, 2-hydroxyethyl (meth)acrylate, 2-hydroxypropyl (meth) acrylate, 3-hydroxypropyl (meth)acrylate, cyclopentyl (meth)acrylate, 1-methylcyclopentyl (meth)acrylate, cyclohexyl (meth)acrylate, 1-methylcyclohexyl (meth)acrylate, norbornyl (meth)acrylate, isobornyl (meth)acrylate, tricyclodecanyl (meth)acrylate, dicyclopentenyl (meth)acrylate, adamantyl (meth)acrylate, 2-adamantyl-2-methyl (meth) acrylate, 2-adamantyl-2-ethyl (meth)acrylate, tetrahydrofuranyl (meth)acrylate, tetrahydropyranyl (meth)acrylate, phenyl (meth)acrylate, benzyl (meth)acrylate, phenethyl (meth)acrylate, (dimethyl)(p-methylcyclohexyl)methyl (meth)acrylate, (dimethyl)(norbornyl)methyl (meth) acrylate, and (dimethyl)(phenyl)methyl (meth)acrylate; unsaturated carboxylic acids such as (meth)acrylic acid, crotonic acid, maleic acid, fumaric acid, and cinnamic acid, as well as anhydrides of these acids; carboxylalkyl esters of unsaturated carboxylic acids such as 2-carboxyethyl (meth) acrylate, 2-carboxypropyl (meth)acrylate, and 3-carboxypropyl (meth)acrylate; unsaturated nitryl compounds such as (meth)acrylonitrile, α-chloroacrylonitrile, crotonitrile, maleinitrile, and fumaronitrile; unsaturated amide compounds such as (meth)acrylamide, N,N-dimethyl (meth)acrylamide, crotonamide, maleinamide, and fumaramide; unsaturated imide compounds such as maleimide, N-phenylmaleimide, and N-cyclohexylmaleimide; and other nitrogen-containing vinyl compounds such as N-vinyl-ε-caprolactam, N-vinylpyrrolidone, 2-vinylpyridine, 3-vinylpyridine, 4-vinylpyridine, 2-vinylimidazole, and 4-vinylimidazole.

Of these the recurring units, groups obtained by cleavage of a polymerizable unsaturated bond in the compound such as a styrene, α-methylstyrene, p-t-butoxystyrene, p-t-butoxycarbonyloxystyrene, p-t-butoxycarbonylmethyloxystyrene, p-acetoxystyrene, p-(2-t-butoxycarbonylethyloxy) styrene, t-butyl (meth)acrylate, isobornyl (meth)acrylate, tricyclodecanyl (meth)acrylate, 2-adamantyl-2-methyl (meth)acrylate, 2-adamantyl-2-ethyl (meth)acrylate, or the like are preferable.

These other recurring units may be used in the resin (B) either individually or in combination of two or more.

The proportion of the recurring units (2) in the total number of the recurring units (2) and the recurring units (3) is preferably 5–90%, and still more preferably 10–80%, although the proportion varies according to the structure of an acetal group in the recurring units (2), types and amounts of the other recurring units and cross-linking groups, and the like.

The amount of the other recurring units is usually 50 mol % or less, and preferably 30 mol % or less.

The amount of the cross-linking groups is usually 15 mol % or less, and preferably 10 mol % or less of the total recurring units.

The polystyrene-reduced weight average molecular weight (hereinafter referred to as "Mw") of the resin (B) determined by gel permeation chromatography is usually 1,000–500,000, and preferably 3,000–300,000.

The ratio of Mw to the polystyrene-reduced number average molecular weight (hereinafter referred to as "Mn") determined by gel permeation chromatography (Mw/Mn) of the resin (B) is usually 1–5, and preferably 1–3.

The resin (B) is prepared using the following methods, for example.

(a) A method of adding a vinyl ether compound such as ethyl vinyl ether, n-butyl vinyl ether, or cyclohexyl vinyl ether to a part of phenolic hydroxyl groups in a p-hydroxystyrene (co)polymer under weakly acidic conditions.

(b) A method of adding a vinyl ether compound such as ethyl vinyl ether, n-butyl vinyl ether, or cyclohexyl vinyl ether to a part of phenolic hydroxyl groups in p-hydroxystyrene under weakly acidic conditions to produce a monomer corresponding to the recurring unit (2), and copolymerizing this monomer with p-hydroxystyrene according to a conventional method.

A partial cross-linked structure in the resin (B) formed by a cross-linking group having a diethylene glycol skeleton can be introduced by, for example, reacting an appropriate amount of diethylene glycol divinyl ether simultaneously in the addition reaction of a vinyl ether compound in the above method (a).

Other Resins Containing Acid-dissociable Group

In the present invention, acid-dissociable group containing resins other than the resin (B) (hereinafter referred to as "other acid-dissociable group containing resins") can be used in combination with the resin (B). Such other acid-dissociable group containing resins will now be described in detail.

Such other acid-dissociable group-containing resins are resins insoluble or scarcely soluble in alkali which are protected by an acid-dissociable group and become alkali-soluble when the acid-dissociable group dissociates.

The term "insoluble or scarcely soluble in alkali" used herein refers to characteristics in which 50% or more of the initial thickness of a resin film remains after development under alkaline development conditions employed when forming a resist pattern using a resist film formed from the radiation-sensitive resin composition comprising other acid-dissociable group containing resins.

As examples of other acid-dissociable group-containing resins, a resin insoluble or scarcely soluble in alkali by itself, which has a structure in which a hydrogen atom of an acidic functional group in an alkali-soluble resin having one or more acidic functional groups such as a phenolic hydroxyl group and a carboxyl group (for example, an alkali-soluble resin having one or more recurring units shown by the following formulas (6) to (8)) is replaced by one or more acid-dissociable groups which dissociate in the presence of an acid (hereinafter called "resin (b1)"), and a resin insoluble or scarcely soluble in alkali by itself, which has a structure in which a hydrogen atom of a phenolic hydroxyl group in an alkali-soluble resin having one or more recurring units shown by the following formula (9) is replaced by one or more acid-dissociable groups which dissociate in the presence of an acid (hereinafter called "resin (b2)") can be given, (the resin (b1) and resin (b2) are hereinafter collectively referred to as "resin (b)")

(6)

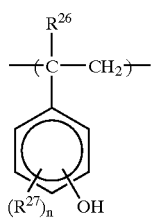

wherein $R^{26}$ represents a hydrogen atom or a methyl group, $R^{27}$ is a halogen atom or an organic group having 1–6 carbon atoms, and n is an integer of 0–3;

(7)

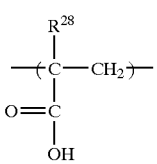

wherein $R^{28}$ represents a hydrogen atom or a methyl group;

(8)

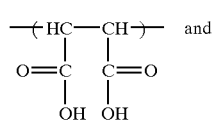

(9)

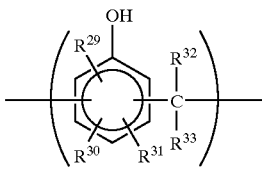

wherein $R^{29}$, $R^{30}$, $R^{31}$, $R^{32}$, and $R^{33}$ individually represent a hydrogen atom or a linear or branched alkyl group having 1–4 carbon atoms.

As examples of the acid-dissociable group in the resin (b), a substituted methyl group, 1-substituted ethyl group, 1-substituted propyl group, 1-branched alkyl group, silyl group, germyl group, alkoxycarbonyl group, acyl group, cyclic acid-dissociable group, and the like can be given. When a structure obtained by replacing a hydrogen atom of a phenolic hydroxyl group in the unit originating from p-hydroxystyrene by an acid-dissociable group corresponds to the recurring unit (2), such an acid-dissociable group is excluded from the acid-dissociable group in the resin (b).

As examples of a substituted methyl group, a methoxymethyl group, methylthiomethyl group, ethoxymethyl group, ethylthiomethyl group, methoxyethoxymethyl group, benzyloxymethyl group, benzylthiomethyl group, phenacyl group, bromophenacyl group, methoxyphenacyl group, methylthiophenacyl group, α-methylphenacyl group, cyclopropylmethyl group, benzyl group, diphenylmethyl group, triphenylmethyl group, bromobenzyl group, nitrobenzyl group, methoxybenzyl group, methylthiobenzyl group, ethoxybenzyl group, ethylthiobenzyl group, piperonyl group, methoxycarbonylmethyl group, ethoxycarbonylmethyl group, n-propoxycarbonylmethyl group, i-propoxycarbonylmethyl group, n-butoxycarbonylmethyl group, t-butoxycarbonylmethyl group, and the like can be given.

As examples of the 1-substituted ethyl group, a 1-methoxyethyl group, 1-methylthioethyl group, 1,1-dimethoxyethyl group, 1-ethoxyethyl group, 1-ethylthioethyl group, 1,1-diethoxyethyl group, 1-phenoxyethyl group, 1-phenylthioethyl group, 1,1-diphenoxyethyl group, 1-benzyloxyethyl group, 1-benzylthioethyl group, 1-cyclopropylethyl group, 1-phenylethyl group, 1,1-diphenylethyl group, 1-methoxycarbonylethyl group, 1-ethoxycarbonylethyl group, 1-n-propoxycarbonylethyl group, 1-i-propoxycarbonylethyl group, 1-n-butoxycarbonylethyl group, 1-t-butoxycarbonylethyl group, and the like can be given.

As examples of 1-branched alkyl group, an i-propyl group, sec-butyl group, t-butyl group, 1,1-dimethylpropyl group, 1-methylbutyl group, 1,1-dimethylbutyl group, and the like can be given.

As examples of a 1-substituted propyl group, a 1-methoxypropyl group, 1-ethoxypropyl group, and the like can be given.

As examples of the silyl group, a trimethylsilyl group, ethyldimethylsilyl group, methyldiethylsilyl group, triethylsilyl group, i-propyldimethylsilyl group, methyldi-i-propylsilyl group, tri-i-propylsilyl group, t-butyldimethylsilyl group, methyldi-t-butylsilyl group, tri-t-butylsilyl group, phenyldimethylsilyl group, methyldiphenylsilyl group, triphenylsilyl group, and the like can be given.

As examples of the germyl group, a trimethylgermyl group, ethyldimethylgermyl group, methyldiethylgermyl group, triethylgermyl group, i-propyldimethylgermyl group, methyldi-i-propylgermyl group, tri-i-propylgermyl group, t-butyldimethylgermyl group, methyldi-t-butylgermyl group, tri-t-butylgermyl group, phenyldimethylgermyl group, methyldiphenylgermyl group, triphenylgermyl group, and the like can be given.

As examples of the alkoxycarbonyl group, a methoxycarbonyl group, ethoxycarbonyl group, i-propoxycarbonyl group, t-butoxycarbonyl group, and the like can be given.

As examples of the acyl group, an acetyl group, propionyl group, butyryl group, heptanoyl group, hexanoyl group, valeryl group, pivaloyl group, isovaleryl group, lauryloyl group, myristoyl group, palmitoyl group, stearoyl group, oxalyl group, malonyl group, scucinyl group, glutaryl group, adipoyl group, piperoyl group, suberoyl group, azelaoyl group, sebacoyl group, acryloyl group, propioloyl group, methacryloyl group, crotonoyl group, oleoyl group, maleoyl group, fumaroyl group, mesaconoyl group, campholoyl group, benzoyl group, phthaloyl group, isophthaloyl group, terephthaloyl group, naphthoyl group, toluoyl group, hydroatropoyl group, atropoyl group, cinnamoyl group, furoyl group, thenoyl group, nicotinoyl group, isonicotinoyl group, p-toluenesulfonyl group, mesyl group, and the like can be given.

As examples of the cyclic acid-dissociable group, a cyclopropyl group, cyclopentyl group, cyclohexyl group, cyclohexenyl group, p-methoxycyclohexyl group, tetrahydropyranyl group, tetrahydrofuranyl group, tetrahydrothiopyranyl group, tetrahydrothiofuranyl group, 3-bromotetrahydropyranyl group, 4-methoxytetrahydropyranyl group, 4-methoxytetrahydrothiopyranyl group, 3-tetrahydrothiophene-1,1-dioxide group, and the like can be given.

Of these acid-dissociable groups, a t-butyl group, 1-methoxymethyl group, 1-methoxyethyl group, 1-ethoxyethyl group, 1-ethoxypropyl group, 1-propoxyethyl group, trimethylsilyl group, t-butoxycarbonyl group, t-butoxycarbonylmethyl group, tetrahydropyranyl group, tetrahydrofuranyl group, and the like are preferable.

The percentage of the acid-dissociable group introduced into the resin (b) (percentage of the number of acid-dissociable groups among the total number of acidic functional groups and acid-dissociable groups in the resin (b)) is preferably 10–100%, and still more preferably 15–100%, although the percentage varies depending on types of acid-dissociable group and the alkali-soluble resin into which the acid-dissociable group is introduced.

Mw of the resin (b) is preferably 1,000–150,000, and still more preferably 3,000–100,000.

Mw/Mn of the resin (b) is 1–5, and preferably 1–3. The resin (b) is prepared using a method of introducing one or more acid-dissociable groups into an alkali-soluble resin prepared in advance, the resin (b1) is prepared by (co)polymerizing one or more polymerizable unsaturated monomers having an acid-dissociable group, and the resin (b2) is prepared by (co)polycondensing one or more polycondensing components having an acid-dissociable group.

In the present invention, the above other acid-dissociable group-containing resins can be used either individually or in combination of two or more.

Other Additives

The radiation-sensitive resin composition of the present invention contains the acid generator (A) and the resin (B) as essential components, and may further contain other acid generators and other acid-dissociable group-containing resins as optional components. In addition to these components, additives such as dissolution controllers, acid diffusion controllers, surfactants, and sensitizers may be added to the radiation-sensitive resin composition of the present invention.

Dissolution Controller

As a dissolution controller, a compound having an acid functional group such as a phenolic hydroxyl group, carboxyl group, or the like, a compound obtained by replacing one or more hydrogen atoms in such a compound by a substitution group capable of dissociating in the presence of an acid (hereinafter referred to as "acid-dissociable substituent"), and the like can be given.

As examples of such an acid-dissociable substituent, the same groups as the acid-dissociable group mentioned in connection with the other acid-dissociable group-containing resins, such as a substituted methyl group, 1-substituted ethyl group, 1-substituted n-propyl group, 1-branched alkyl group, silyl group, germyl group, alkoxycarbonyl group, acyl group, cyclic acid-dissociable group, and the like, can be given.

The alkali solubility control agent may be either a low molecular weight compound or a high molecular weight compound. The compounds shown by the following formulas (10) to (14) can be given as specific examples of the low molecular weight compound.

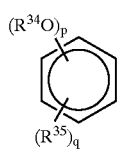
(10)

wherein $R^{34}$ groups individually indicate a hydrogen atom or an acid-dissociable substituent, $R^{35}$ groups individually represent a linear or branched alkyl group having 1–4 carbon atoms, a phenyl group, or a 1-naphthyl group, p is an integer of 1 or more, and q is an integer of 0 or more, provided that $p+q \leq 6$;

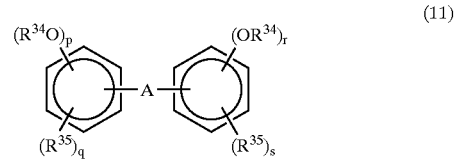
(11)

wherein $R^{34}$ and $R^{35}$ are the same as defined for the above formula (10), and A represents —O—, —S—, —CO—, —COO—, —SO—, —SO$_2$—, —C($R^{36}$)($R^{37}$)—, wherein $R^{36}$ and $R^{37}$ individually represent a hydrogen atom, a linear, branched, or cyclic alkyl group having 1–6 carbon atoms, an acyl group having 2–11 carbon atoms, a phenyl group, or a 1-naphthyl group, or a group shown by the following formula,

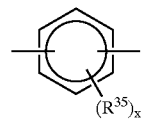

wherein $R^{35}$ is the same as defined above and x is an integer of 0–4, and p, q, r, and s are integers of 0 or more, provided that $p+q \leq 5$, $r+s \leq 5$, and $p+r \geq 1$ are satisfied;

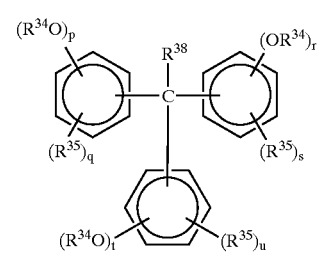
(12)

wherein $R^{34}$ and $R^{35}$ are the same as those defined in the formula (10), $R^{38}$ represents a hydrogen atom, a linear or branched alkyl group having 1–4 carbon atoms, or a phenyl group, and p, q, r, s, t, and u are integers of 0 or more, provided that $p+q \leq 5$, $r+s \leq 5$, $t+u \leq 5$, and $p+r+t \geq 1$ are satisfied;

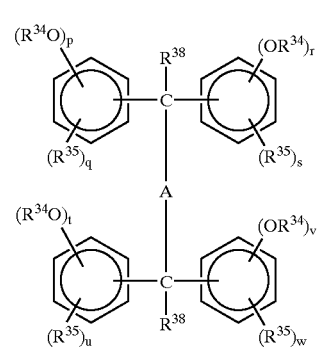
(13)

wherein $R^{34}$ and $R^{35}$ are the same as defined for the above formula (10), A is the same as defined in the above formula (11), $R^{38}$ is the same as defined in the formula (12), provided that when two or more $R^{38}$ groups are present, such groups may be either identical or different, and p, q, r, s, t, u, v, and w are integers of 0 or more, provided that $p+q \leq 5$, $r+s \leq 5$, $t+u \leq 5$, $v+w \leq 5$, and $p+r+t+v \geq 1$ are satisfied; and

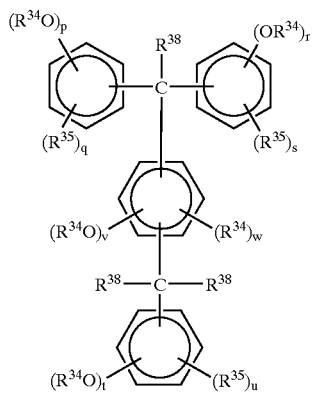

(14)

wherein $R^{34}$ and $R^{35}$ are the same as defined for the above formula (10), $R^{38}$ is the same as defined in the formula (12), provided that when two or more $R^{38}$ groups are present, such groups may be either identical or different, and p, q, r, s, t, u, v, and w are integers of 0 or more, provided that $p+q \leqq 5$, $r+s \leqq 5$, $t+u \leqq 5$, $v+w \leqq 4$, and $p+r+t+v \geqq 1$ are satisfied.

These dissolution controllers may be used either individually or in combination of two or more.

Acid Diffusion Controller

The acid diffusion controller controls diffusion of an acid generated from the acid generator (A) upon exposure in the resist film and suppresses undesired chemical reactions in the unexposed area. The addition of the acid diffusion controller improves storage stability of the composition and resolution as a resist. Moreover, the addition of the acid diffusion controller prevents the line width of the resist pattern from changing due to variation of post-exposure delay (PED) from exposure to development, whereby a composition with remarkably superior process stability can be obtained.

As examples of such acid diffusion controllers, a compound shown by the following formula (15) (hereinafter called "nitrogen-containing compound (i)"),

(15)

wherein $R^{39}$, $R^{40}$, and $R^{41}$ individually represents a hydrogen atom, a substituted or unsubstituted alkyl group, substituted or unsubstituted aryl group, or substituted or unsubstituted aralkyl group; a diamino compound having two nitrogen atoms in the molecule (hereinafter referred to as "nitrogen-containing compound (ii)"); a polymer having three or more nitrogen atoms in the molecule (hereinafter referred to as "nitrogen-containing compound (iii)"); a low molecular weight compound with one or more amino groups having at least one hydrogen atom bonded to the nitrogen atom, in which one or more hydrogen atoms are replaced by a t-butoxycarbonyl group (hereinafter referred to as "nitrogen-containing compound (iv)"); an amide group-containing compound, urea compound, nitrogen-containing heterocyclic compound; and the like can be given.

The following compounds can be given as examples of the nitrogen-containing compound (i): linear, branched, or cyclic monoalkylamines such as n-hexylamine, n-heptylamine, n-octylamine, n-nonyamine, n-decylamine, n-dodecylamine, and cyclohexylamine; linear, branched, or cyclic dialkylamines such as di-n-butylamine, di-n-pentylamine, di-n-hexylamine, di-n-heptylamine, di-n-octylamine, di-n-nonylamine, di-n-decylamine, methyl.n-dodecylamine, di-n-dodecylamine, methyl-cyclohexylamine, and dicyclohexylamine; linear, branched, or cyclic trialkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, n-dodecyldimethylamine, methyl di-n-dodecyl amine, tri-n-dodecylamine, cyclohexyldimethylamine, methyldicyclohexylamine, and tricyclohexylamine; linear, branched, or cyclic alkanolamines such as ethanolamine, diethanolamine, triethanolamine, and tri-i-propanolamine, and aromatic amines such as aniline, N-methylaniline, N,N-dimethylaniline, o-methylaniline, m-methylaniline, p-methylaniline, p-nitroaniline, methyl-phenylamine, diphenylamine, phenyldimethylamine, methyldiphenyl-amine, triphenylamine, 1-naphthylamine, and 2-naphthyl-amine.

Examples of the nitrogen-containing compounds (ii) include ethylenediamine, N,N,N',N'-tetramethylenediamine, tetramethylenediamine, hexamethylenediamine, 4,4'-diaminodiphenylmethane, 4,4'-diamino diphenyl ether, 4,4'-diaminobenzophenone, 4,4'-diaminodiphenylamine, N,N,N',N'-tetrakis(2-hydroxyethyl)ethylenediamine, N,N,N',N'-tetrakis(2-hydroxypropyl)ethylenediamine, 2,2-bis(p-aminophenyl)propane, 2-(m-aminophenyl)-2-(p-aminophenyl)propane, 2-(p-aminophenyl)-2-(m-hydroxyphenyl)propane, 2-(p-aminophenyl)-2-(p-hydroxyphenyl)propane, 1,4-bis[1-(p-aminophenyl)-1-methylethyl]benzene, 1,3-bis[1-(p-aminophenyl)-1-methylethyl]benzene, bis (2-dimethylaminoethyl)ether, bis (2-diethylaminoethyl)ether, and the like. As examples of the nitrogen-containing compound (iii), polyethyleneimine, polyallylamine, a polymer of dimethylaminoethylacrylamide, and the like can be given.

The following compounds can be given as examples of the nitrogen-containing compound (iv): linear, branched, or cyclic dialkylamines such as N-t-butoxycarbonyl di-n-octylamine and N-t-butoxycarbonyldicyclohexylamine; adamantylamine derivatives such as N-t-butoxycarbonyl-1-adamantylamine, N-t-butoxycarbonyl-N-methyl-1-adamantylamine, and N,N-di-t-butoxycarbonyl-1-adamantylamine; other diamine derivatives such as N-t-butoxycarbonyl-4,4'-diaminodiphenylmethane, N,N'-di-t-butoxycarbonyl-4,4'-diaminodiphenylmethane, N,N'-di-t-butoxycarbonylhexamethylenediamine, N,N,N'N'-tetra-t-butoxycarbonylhexamethylenediamine, N,N'-di-t-butoxycarbonyl-1,7-diamino-n-heptane, N,N'-di-t-butoxycarbonyl-1,8-diamino-n-octane, N,N'-di-t-butoxycarbonyl-1,10-diamino-n-decane, and N,N'-di-t-butoxycarbonyl-1,12-diamino-n-dodecane; and imidazole derivatives such as N-t-butoxycarbonylbenzimidazole, N-t-butoxycarbonyl-2-methylbenzimidazole, and N-t-butoxycarbonyl-2-phenylbenzimidazole.

Examples of compounds containing an amide group include formamide, N-methylformamide, N,N-dimethylformamide, acetamide, N-methylacetamide, N,N-dimethylacetamide, propionamide, benzamide, pyrrolidone, N-methylpyrrolidone, and the like.

Examples of the urea compounds include urea, methylurea, 1,1-dimethylurea, 1,3-dimethylurea, 1,1,3,3-tetramethylurea, 1,3-diphenylurea, tri-n-butylthiourea, and the like.

Examples of the nitrogen-containing heterocyclic compounds include imidazoles such as imidazole, 4-methylimidazole, 2-phenylimidazole, 4-methyl-2- phenylimidazole, benzimidazole, and 2-phenylbenz- imidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, 2-benzylpyridine, 4-benzylpyridine, 2,6-dimethanolpyridine, nicotine, nicotinic acid, nicotinic acid amide, quinoline, 8-oxyquinoline, and acridine; pyrazine, pyrazole, pyridazine, quinoxaline, purine, pyrrolidine, piperidine, piperidine ethanol, morpholine, 4-methylmorpholine, piperazine, 1,4-dimethylpiperazine, 1,4-diazabicyclo[2.2.2]octane; and the like.

Of these nitrogen-containing organic compounds, nitrogen-containing compounds (i), nitrogen-containing compounds (iv), and nitrogen-containing heterocyclic compounds are preferable. Among the nitrogen-containing compounds (i), trialkylamines and alkanolamines are particularly preferable. Among the nitrogen-containing compounds (iv), dialkylamine derivatives and imidazole derivatives are particularly preferable. Among the nitrogen-containing heterocyclic compounds, imidazoles and pyridines are particularly preferable.

The acid diffusion controller may be used either individually or in combination of two or more.

Surfactant:

Surfactants improve applicability, striation, and developability of the radiation-sensitive resin composition.

As surfactants, any of anionic-type surfactants, cationic-type surfactants, nonionic-type surfactants, and ampholytic-type surfactants may be used. Of these, nonionic-type surfactants are preferable.

As examples of nonionic-type surfactants, polyoxyethylene higher alkyl ethers, polyoxyethylene higher alkyl phenyl ethers, higher fatty acid diesters of polyethylene glycol, commercially available products such as KP (manufactured by Shin-Etsu Chemical Co., Ltd.), Polyflow (manufactured by Kyoeisha Chemical Co., Ltd.), EFTOP (manufactured by TOHKEM PRODUCTS CORPORATION), MEGAFAC (manufactured by Dainippon Ink and Chemicals, Inc.), Fluorad (manufactured by Sumitomo 3M, Ltd.), Asahi Guard, Surflon (manufactured by Asahi Glass Co., Ltd.), and the like can be given.

These surfactants may be used either individually or in combination of two or more.

Sensitizers Etc.

Sensitizers absorb energy of radiation and transmit the energy to the acid generator (A) or other acid generators, thereby increasing the amount of an acid to be generated upon exposure. The sensitizers thus improve apparent sensitivity of the radiation-sensitive resin composition.

As examples of preferable sensitizers, acetophenones, benzophenones, naphthalenes, biacetyl, Eosine, Rose Bengale, pyrenes, anthracenes, phenothiazines, and the like can be given.

These sensitizers may be used either individually or in combinations of two or more. The addition of dyes or pigments visualizes a latent image in the exposed area, thereby relaxing the effect of halation at the time of exposure. Use of adhesion improvers improves adhesion to substrates.

As other additives, halation inhibitors, preservation stabilizers, antifoaming agents, form improvers, and the like can be added. Specific additives include 4-hydroxy-4'-methylchalcone, and the like.

Radiation-sensitive Resin Composition

The radiation-sensitive resin composition of the present invention contains the acid generator (A) and the resin (B) as essential components, and may further contain other acid generators, other acid-dissociable group-containing resins, and other additives. The proportion of major components in the radiation-sensitive resin composition is as follows.

The amount of the acid generator (A) is usually 0.01–20 parts by weight, preferably 0.1–15 parts by weight, and still more preferably 0.3–8 parts by weight for 100 parts by weight of the total amount of resin components in the resin composition. If the amount of acid generator (A) is less than 0.01 part by weight, sensitivity and resolution as a resist and the effect of decreasing nano-edge roughness tend to be impaired; if more than 20 parts by weight, coatablity and heat resistance as a resist tends to decrease.

The amount of the acid generator (A) and other acid generators is usually 0.02–80 parts by weight, preferably 0.2–50 parts by weight, and still more preferably 0.3–30 parts by weight for 100 parts by weight of the total amount of resin components in the resin composition.

The amount of the acid generator (A) among the total amount of acid generators is preferably 0.5 wt % or more, and particularly preferably 1 wt % or more. If the amount of the acid generator (A) is less than 0.5 wt %, the effect of decreasing nano-edge roughness may be impaired.

The amount of the resin (B) used in the whole acid-dissociable group-containing resins is usually 10 wt % or more, and preferably 20 wt % or more. If the amount of the resin (B) is less than 10 wt %, resolution as a resist tends to be impaired.

The amount of dissolution controllers is 50 parts by weight or less, and preferably 30 parts by weight or less, for 100 parts by weight of the total amount of resin components, although the specific amount varies according to the types of the dissolution controllers, resin (B), and resin (b). If the amount of the dissolution controllers exceeds 50 parts by weight, heat resistance as a resist tends to decrease.

The amount of acid diffusion controllers is usually 10 parts by weight or less, and preferably 5 parts by weight or less, for 100 parts by weight of the total amount of resin components, although the specific amount varies according to the types of the acid diffusion controllers, acid generator (A), and other acid generators. If the amount of the acid diffusion controllers is more than 10 parts by weight, sensitivity as a resist and developability of the exposed area tend to decrease.

The proportion of the surfactants to be added is usually 2 parts by weight or less, as an effective component of the surfactants, for 100 parts by weight of the total resin component in the resin composition.

The amount of sensitizers to be added is 50 parts by weight or less, and preferably 30 parts by weight or less, for 100 parts by weight of the total amount of resins in the resin composition.

Composition Solution

The radiation-sensitive resin composition of the present invention is prepared as a composition solution by dissolving the components in a solvent so that the solid content is usually in the range of 1–50 wt % and filtering the composition using a filter with a pore diameter of about 0.2 $\mu$m.

As the solvents, ethers, esters, ether esters, ketones, ketone esters, amides, amide esters, lactams, lactones, and (halogenated) hydrocarbons are used. Specific examples include ethylene glycol monoalkyl ethers, diethylene glycol dialkyl ethers, propylene glycol monoalkyl ethers, propylene glycol dialkyl ethers, ethylene glycol monoalkyl ether acetates, propylene glycol monoalkyl ether acetates, acetic acid esters, hydroxyacetates, lactates, alkoxyacetate, acetoacetate, pyruvates, propionates, butyrates, 2-hydroxy-2-methyl propionate, 3-alkoxypropionate, 2-hydroxy-3- methyl butyrate, cyclic or non-cyclic ketones, N,N-dialkylformamides, N,N-dialkylacetamides, N-alkylpyrrolidones, γ-lactones, (halogenated) aliphatic hydrocarbons, (halogenated) aromatic hydrocarbons, and the like.

Examples of specific compounds used as a solvent include ethylene glycol monomethyl ether, ethylene glycol monoethyl ether, ethylene glycol mono-n-propyl ether, ethylene glycol mono-n-butyl ether, diethylene glycol dimethyl ether, diethylene glycol diethyl ether, diethylene glycol di-n-propyl ether, diethylene glycol di-n-butyl ether, ethylene glycol monomethyl ether acetate, ethylene glycol monoethyl ether acetate, propylene glycol monomethyl ether acetate, propylene glycol monoethyl ether acetate, propylene glycol mono-n-propyl ether acetate, iso-propenyl propionate, ethyl acetate, n-propyl acetate, isopropenyl acetate, n-butyl acetate, 3-methoxybutyl acetate, ethyl lactate, 3-methyl-3-methoxybutyl acetate, hydroxyethyl acetate, ethoxyethyl acetate, methyl acetoacetate, ethyl acetoacetate, isopropenyl propionate, 3-methyl-3-methoxybutyl propionate, ethyl 2-hydroxy-2-methyl propionate, methyl 3-methoxy propionate, ethyl 3-methoxy propionate, 3-ethoxymethyl propionate, 3-ethoxyethyl propionate, methyl 2-hydroxy-3-methyl butyrate, methyl ethyl ketone, cyclohexanone, 2-heptanone, 3-heptanone, 4-heptanone, N,N-dimethylformamide, N,N-dimethylacetamide, N-methylpyrrolidone, toluene, xylene, and the like.

Of these solvents, propylene glycol monoalkyl ether acetates, lactates, 3-alkoxypropionates, 2-heptanone, cycloheptanone, and the like are preferable.

These solvents may be used either individually or in combination of two or more.

One or more solvents with a high boiling point may be added to the solvent. Examples of such solvents with a high boiling point include benzyl ethyl ether, di-n-hexyl ether, diethylene glycol monomethyl ether, diethylene glycol monoethyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, ethylene glycol monophenyl ether acetate, and the like.

Formation of Resist Pattern

The radiation-sensitive resin composition of the present invention contains the resin (B) having an acid-dissociable acetal structure. The acetal structure dissociates by the action of an acid generated from the acid generator (A) or the like by radiation and forms a phenolic hydroxyl group which renders the resin soluble or easily soluble in alkali, whereby a positive-tone resist pattern can be formed.

To form a resist pattern from the radiation-sensitive resin composition of the present invention, the composition solution prepared as mentioned above is applied to a substrate by a method such as rotational coating, cast coating, or roll coating to form a resist film.

As a substrate, a silicon substrate, a substrate covered with aluminum, a basic substrate of silicon nitride or titanium nitride, a substrate covered with an inorganic nitride film or an organic antireflection film, and the like can be used.

After a heat treatment or pre-baking (hereinafter referred to as "PB"), the resist film is exposed to radiation through a mask with a prescribed pattern. As examples of radiation which can be used here, deep ultraviolet rays such as a bright line spectrum of a mercury lamp (wavelength: 254 nm), KrF excimer laser (wavelength: 248 nm), ArF excimer laser (wavelength: 193 nm), and F2 excimer laser (wavelength: 157 nm), as well as charged particle rays such as electron beams are preferable. Moreover, according to the types of other acid generators, X-rays such as synchrotron radiation, and ultraviolet rays such as i-rays (wavelength: 365 nm) can be used. The exposure conditions such as the amount of rays are determined appropriately according to the composition of the resin composition, types of other additives, and the like.

After exposure, a post exposure bake (hereinafter referred to as "PEB") is preferably performed in order to improve the apparent sensitivity of the resist. The heating temperature is usually 30–200° C., and preferably 50–150° C., although the heating conditions vary according to the composition of the resin composition, types of other additives, and the like.

The resist coating is then developed using an alkaline developer to form a specific resist pattern.

As the above alkaline developer, an alkaline aqueous solution containing one or more alkaline compounds such as alkaline metal hydroxides, aqueous ammonia, alkylamines, alkanolamines, heterocyclic amines, tetraalkylammonium hydroxides, corrin, 1,8-diazabicyclo[5.4.0]-7-undecene, and 1,5-diazabicyclo[4.3.0]-5-nonene at a concentration of usually 5–10 wt %, and preferably 2–5 wt % is used. Of these, an aqueous solution of tetraalkylammonium hydroxides is particularly preferable.

An appropriate amount of a water-soluble organic solvent such as methanol and ethanol, surfactants, and the like may be added to a developer consisting of an alkaline aqueous solution.

When a developer consisting of the above alkaline aqueous solution is used, the resist film is generally washed after development.

EXAMPLES

The embodiments of the present invention will be described in more detail by examples. However, these examples should not be construed as limiting the present invention.

Examples 1–14 and Comparative Examples 1–2

Components shown in Table 1 (part(s) indicates part(s) by weight) were mixed to prepare homogeneous solutions. The solutions were filtered through a Teflon membrane filter with a pore diameter of 0.2 μm to prepare solution compositions.

The composition solutions were coated on a silicon wafer by rotation coating and pre-baked at the temperature and period of time shown in Table 2 to form resist films with a thickness of 0.5 μm or 0.1 μm (in the case where the film is exposed to an F2 excimer laser). The resist films were exposed to a KrF excimer laser with a wavelength of 248 nm using a KrF excimer laser irradiation apparatus "NSR-2005 EX8A" (manufactured by Nikon Corp.) through a mask pattern while changing the dose of radiation. In some of the Examples, instead of a KrF excimer laser, the resist films were exposed to electron beams using a simple-type electron beam direct patterning apparatus (50 KeV) ("HL700D-M" (current density 4.5 A) manufactured by Hitachi, Ltd.) or a simple-type F2 excimer laser irradiation apparatus (manufactured by Exitech Co.) through a mask pattern while changing the dose of radiation. After exposure to radiation, the resist films were treated with heat (PEB) at the temperature and period of time shown in Table 2. The resist films were then developed in a 2.38 wt % tetramethyl ammonium hydroxide aqueous solution at 23° C. for 60 seconds, washed with water for 30 seconds, and dried to form resist patterns.

The evaluation results of the Examples and Comparative Examples are shown in Table 3. The results of sensitivity and resolution are shown for samples exposed to an F2 excimer laser because the resist films used were too thin to obtain the results of nano-edge roughness evaluation.

Evaluation of resists was carried out as follows.

Sensitivity

Sensitivity was evaluated based on an optimum exposure dose which is a dose capable of forming a 1:1 line and space pattern (1L1S) with a line width of 0.25 µm, when a resist film formed on a silicon wafer is exposed to light at a varied dose, immediately followed by baking, alkali development, washing with water, and drying.

Resolution

The minimum dimension (µm) of a resist pattern resolved at the optimum dose was taken as the resolution of the resist film.

Nano-edge Roughness

A 1L1S line pattern with a designed line width of 0.25 µm was observed by a scanning electron microscope to measure a dimension (ΔCD), which is a maximum projection from the designed line width of 0.25 µm in the irregularity produced along the side of the line pattern, as shown in FIG. 1. The nano-edge roughness of resist films was evaluated according to the following standard. FIG. 1(a) is a plan view and FIG. 1(b) is a side view of a resist pattern. The irregularity shown in the FIGURE is exaggerated for explanation.

ΔCD<0.01 µm: Good

ΔCD≧0.01 µm: Bad

The following components were used in Examples and Comparative Examples.

Acid Generator (A)

A-1: 2,4,6-trimethylphenyldiphenylsulfonium 2,4-difluorobenzenesulfonate

A-2: 2,4,6-trimethylphenyldiphenylsulfonium 4-trifluoromethylbenzenesulfonate

A-3: 4-t-butoxy-2,6-dimethylphenyldiphenylsulfonium 2,3,4,5,6-pentafluorobenzenesulfonate A-4: 4-t-butoxycarbonylmethoxy-2,6-dimethylphenyldiphenylsulfonium 2,4,6-tris(trifluoromethyl)benzenesulfonate a-1: 1,1-bis(phenylsulfonyl)cyclohexane a-2: triphenylsulfonium nonafluoro-n-butanesulfonate a-3: bis(4-t-butylphenyl)iodonium 10-camphorsulfonate a-4: bis(cyclohexylsulfonyl)diazomethane a-5: bis(1,4-dioxaspiro[4.5]decane-7-sulfonyl)diazomethane a-6: bis(t-butylsulfonyl)diazomethane a-7: (5-propylsulfoniumoxyimino-5H-thiophen-2-ilydene)-(2-methylphenyl)acetonitrile, (B) Resin B-1: poly(p-hydroxystyrene) resin in which 34 mol % of hydrogen atoms of phenolic hydroxyl groups have been replaced by 1-ethoxyethyl groups (Mw=9,000, Mw/Mn=1.9)

B-2: poly(p-hydroxystyrene) resin in which 15 mol % of hydrogen atoms of phenolic hydroxyl groups have been replaced by 1-ethoxyethyl groups and 18 mol % by 1-ethoxypropyl groups (Mw=10,000, Mw/Mn=1.2)

B-3: poly(p-hydroxystyrene) resin in which 25 mol % of hydrogen atoms of phenolic hydroxyl groups have been replaced by 1-ethoxyethyl groups and 8 mol % by t-butoxycarbonyl groups (Mw=10,000, Mw/Mn=1.1)

B-4: poly(p-hydroxystyrene) resin in which 23 mol % of hydrogen atoms of phenolic hydroxyl groups have been replaced by 1-ethoxyethyl groups and 10 mol % by t-butyl groups (Mw=12,000, Mw/Mn=1.2)

B-5: p-hydroxystyrene/styrene copolymer (copolymerization ratio: 90:10) resin in which 25 mol % of hydrogen atoms of phenolic hydroxyl groups have been replaced by 1-cyclohexyloxyethyl groups (Mw=18,000, Mw/Mn=1.9)

B-6: p-hydroxystyrene/t-butyl acrylate copolymer (copolymerization ratio: 90:10) resin in which 25 mol % of hydrogen atoms of phenolic hydroxyl groups have been replaced by 1-ethoxyethyl groups (Mw=18,000, Mw/Mn=1.8)

B-7: Partially cross-linked resin (a hexamer in average) prepared by cross-linking poly(p-hydroxystyrene) (Mw=5,000, Mw/Mn=1.8), in which 24 mol % of hydrogen atoms of phenolic hydroxyl groups have been replaced by 1-ethoxyethyl groups, using a cross-linker having a diethylene glycol skeleton (Mw=30,000, Mw/Mn=5.0) The cross-linking reaction was carried out by reacting the poly(p-hydroxystyrene) (Mw=5,000) with ethyl vinyl ether and diethylene glycol divinyl ether in the presence of pyridinium p-toluenesulfonate.

Resin (b)

b-1: poly(p-hydroxystyrene) resin in which 26 mol % of hydrogen atoms of phenolic hydroxyl groups have been replaced by t-butoxycarbonyl groups (Mw=9,000, Mw/Mn=1.9)

b-2: poly(p-hydroxystyrene) resin in which 25 mol % of hydrogen atoms of phenolic hydroxyl groups have been replaced by t-butoxycarbonylmethyl groups (Mw=25,000, Mw/Mn=1.2)

b-3: poly(p-hydroxystyrene) resin in which 32 mol % of hydrogen atoms of phenolic hydroxyl groups have been replaced by t-butyl groups (Mw=15,000, Mw/Mn=1.1)

b-4: p-hydroxystyrene/styrene/butyl acrylate copolymer (copolymerization ratio: 60:20:20, Mw=12,500, Mw/Mn=1.8)

Dissolution Controller

C-1: diphenolic acid

C-2: 2-hydroxybenzophenone

Acid Diffusion Controller

D-1: n-dodecyldimethylamine

D-2: tri-n-hexylamine

D-3: benzimidazole

D-4: 2-benzylpyridine

D-5: 2-phenylbenzimidazole

D-6: triethanolamine

D-7: tri-n-octylamine

Solvent

E-1: ethyl lactate

E-2: propylene glycol monomethyl ether acetate

E-3: 2-heptanone

TABLE 1

| | Acid generator | | Resin | Dissolution controller | Acid diffusion controller | Solvent |
|---|---|---|---|---|---|---|
| | A | a | | | | |
| Example 1 | A-2 (1) | a-4 (6) | B-1 (100) | — | D-1 (0.70) | E-2 (800) |
| Example 2 | A-1 (0.8) | a-5 (8) | B-1 (50) b-1 (50) | — | D-2 (0.30) D-5 (0.15) | E-1 (240) E-2 (560) |
| Example 3 | A-4 (1.5) | a-1 (1) a-4 (6) | B-2 (80) b-2 (20) | — | D-4 (0.35) | E-3 (800) |
| Example 4 | A-1 (2) | a-2 (0.5) a-5 (5) | B-3 (100) | C-1 (5) | D-5 (0.20) D-6 (0.15) | E-1 (240) E-2 (560) |
| Example 5 | A-3 (1.5) | a-1 (1.5) a-6 (4.5) | B-2 (100) | — | D-3 (0.70) | E-2 (800) |
| Example 6 | A-2 (3.5) | — | B-7 (100) | — | D-6 (0.20) D-7 (0.30) | E-1 (240) E-2 (560) |
| Example 7 | A-3 (1.5) | a-4 (4) a-7 (1.5) | B-4 (100) | — | D-7 (0.75) | E-2 (800) |
| Example 8 | A-1 (0.4) | a-6 (8) | B-4 (100) | — | D-5 (0.10) D-6 (0.06) D-7 (0.30) | E-1 (240) E-2 (560) |
| Example 9 | A-2 (1.2) | a-1 (0.5) a-5 (6.5) | B-5 (70) b-3 (30) | — | D-1 (0.70) | E-1 (240) E-2 (560) |
| Example 10 | A-4 (1) | a-3 (1) a-5 (5) | B-5 (100) | — | D-5 (0.75) | E-1 (240) E-2 (560) |
| Example 11 | A-1 (1.5) | a-6 (6) | B-6 (80) b-4 (20) | — | D-2 (0.65) | E-1 (240) E-3 (560) |
| Example 12 | A-2 (2) | a-3 (1) a-6 (5.5) | B-3 (100) | C-2 (5) | D-2 (0.20) D-3 (0.25) | E-1 ((240) E-2 (560) |
| Example 13 | A-1 (1) | a-2 (1.2) a-6 (6) | B-6 (100) | — | D-1 (0.40) D-2 (0.30) | E-1 (240) E-3 (560) |
| Example 14 | A-2 (0.6) | a-3 (1) a-4 (5) | B-7 (70) b-2 (30) | — | D-3 (0.20) D-6 (0.15) | E-1 (240) E-2 (560) |
| Comparative Example 1 | — | a-2 (2) a-4 (5) | B-1 (65) b-1 (35) | — | D-2 (0.70) | E-2 (800) |
| Comparative Example 2 | — | a-2 (3) a-3 (4) | B-4 (100) | — | D-1 (0.10) D-5 (0.30) | E-1 (240) E-2 (560) |

Unit in parenthesis: part by weight

TABLE 2

| | PB | | Radiation | PEB | |
|---|---|---|---|---|---|
| | Temp (° C.) | Time (sec) | | Temp (° C.) | Time (sec) |
| Example 1 | 90 | 90 | KrF excimer laser | 100 | 90 |
| Example 2 | 90 | 60 | KrF excimer laser | 90 | 60 |
| Example 3 | 90 | 60 | KrF excimer laser | 100 | 60 |
| Example 4 | 100 | 60 | excimer laser | 110 | 60 |
| Example 5 | 110 | 90 | KrF excimer laser | 110 | 90 |
| Example 6 | 90 | 60 | KrF excimer laser | 120 | 60 |
| Example 7 | 100 | 60 | KrF excimer laser | 115 | 60 |
| Example 8 | 80 | 60 | KrF excimer laser | 100 | 90 |
| Example 9 | 90 | 60 | KrF excimer laser | 90 | 60 |
| Example 10 | 100 | 60 | KrF excimer laser | 110 | 90 |
| Example 11 | 95 | 90 | KrF excimer laser | 110 | 90 |
| Example 12 | 80 | 60 | KrF excimer laser | 100 | 90 |
| Example 13 | 110 | 60 | Electron beam | 110 | 60 |
| Example 14 | 140 | 90 | F2 excimer laser | 110 | 90 |
| Comparative Example 1 | 100 | 90 | KrF excimer laser | 100 | 90 |
| Comparative Example 2 | 90 | 90 | KrF excimer laser | 100 | 90 |

TABLE 3

| | Sensitivity | Resolution | Nano-edge roughness |
|---|---|---|---|
| Example 1 | 380 J/m² | 0.21 μm | Good |
| Example 2 | 420 J/m² | 0.22 μm | Good |
| Example 3 | 380 J/m² | 0.21 μm | Good |
| Example 4 | 370 J/m² | 0.22 μm | Good |
| Example 5 | 370 J/m² | 0.21 μm | Good |
| Example 6 | 350 J/m² | 0.21 μm | Good |
| Example 7 | 400 J/m² | 0.22 μm | Good |
| Example 8 | 390 J/m² | 0.21 μm | Good |
| Example 9 | 370 J/m² | 0.21 μm | Good |
| Example 10 | 380 J/m² | 0.21 μm | Good |
| Example 11 | 420 J/m² | 0.22 μm | Good |
| Example 12 | 410 J/m² | 0.21 μm | Good |
| Example 13 | 5 μC/cm² | 0.21 μm | Good |
| Example 14 | 160 J/m² | 0.18 μm | Good |
| Comparative Example 1 | 400 J/m² | 0.22 μm | Bad |
| Comparative Example 2 | 380 J/m² | 0.23 μm | Bad |

The radiation-sensitive resin composition of the present invention not only exhibits excellent resolution performance and pattern-forming capability, but also can suppress nano-edge roughness to a minimal extent. The composition therefore can be extremely useful as a chemically-amplified resist for manufacturing semiconductor devices, which will become more and more micronized.

Obviously, numerous modifications and variations of the present invention are possible in light of the above teachings. It is therefore to be understood that, within the scope of the appended claims, the invention may be practiced otherwise than as specifically described herein.

What is claimed is:

1. A positive-tone radiation-sensitive resin composition comprising:

(A) a photoacid generator which is a compound comprising a structure shown by the following formula (1-a) and a structure shown by the following formula (1-b), (1-a)

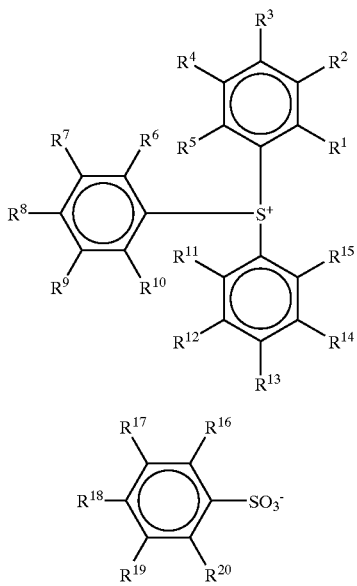

(1-b)

R¹⁸—⟨benzene with R¹⁷, R¹⁶, R¹⁹, R²⁰⟩—SO₃⁻ wherein the groups $R^1$ to $R^{15}$ individually represent a hydrogen atom, a hydroxyl group, a linear, branched, or cyclic alkyl group having 1–10 carbon atoms, a linear, branched, or cyclic alkoxyl group having 1–10 carbon atoms, or a t-butoxycarbonylmethoxy group, provided that two or more of the groups $R^1$ to $R^5$ are groups other than the hydrogen atom, two or more of the groups $R^6$ to $R^{10}$ are groups other than the hydrogen atom, or two or more of the groups $R^{11}$ to $R^{15}$ are groups other than the hydrogen atom; and the groups $R^{16}$ to $R^{20}$ individually represent a hydrogen atom, fluorine atom, or trifluoromethyl group, provided that at least one of the groups $R^{16}$ to $R^{20}$ is a fluorine atom or trifluoromethyl group, and (B) a resin comprising a recurring unit shown by the following formula (2), (2)

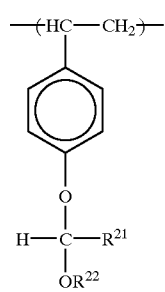

wherein $R^{21}$ represents a methyl group or ethyl group, and $R^{22}$ represents a linear, branched, or cyclic alkyl group having 1–6 carbon atoms, and a recurring unit shown by the following formula (3)

(3)

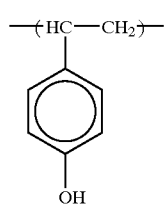

wherein the structure represented by the formula (1-a) is at least one structure selected from the group consisting of 2,4-dimethylphenyldiphenylsulfonium cation, 2,6-dimethylphenyldiphenylsulfonium cation, 2,4,6-trimethylphenyldiphenylsulfonium cation, 2,4,6-triethylphenyldiphenylsulfonium cation, 2,4,6-tri-i-propylphenyldiphenylsulfonium cation, 2,4-di-t-butoxyphenyldiphenylsulfonium cation, 2,4-di-t-butoxycarbonylmethoxyphenyldiphenylsulfonium cation, 4-t-butoxy-2,6-dimethylphenyldiphenylsulfonium cation, and 4-t-butoxycarbonylmethoxy-2,6-dimethylphenyldiphenyl-sulfonium cation.

2. The radiation-sensitive resin composition according to claim 1, wherein the structure represented by the formula (1-b) is at least one structure selected from the group consisting of 4-fluorobenzenesulfonate anion, 2,4-difluorobenzenesulfonat anion, 2,6-difluorobenzenesulfonate anion, 2,3,4,5,6-pentafluorobenzenesulfonate anion, 4-trifluoromethylbenzenesulfonate anion, 2,4-bis(trifluoromethyl)benzenesulfonate anion, 2,4,6-tris(trifluoromethyl)benzenesulfonate anion, and 2,3,4,5,6-pentakis(trifluoromethyl)benzenesulfonate anion.

3. The radiation-sensitive resin composition according to claim 1, wherein the photoacid generator is a compound selected from the group consisting of 2,4-dimethylphenyldiphenylsulfonium 2,3,4,5,6-pentakis(trifluoromethyl)benzenesulfonate, 2,4,6-trimethylphenyldiphenylsulfonium 2,4-difluorobenzenesulfonate, 2,4,6-trimethylphenyldiphenylsulfonium 4-trifluoromethyl-benzenesulfonate, 2,4,6-triethylphenyldiphenylsulfonium 4-trifluoromethylbenzenesulfonate, 2,4,6-tri-i-propylphenyldiphenylsulfonium 2,4-difluorobenzenesulfonate, 4-t-butoxy-2,6-dimethylphenyldiphenylsulfonium 2,3,4,5,6-pentafluorobenzenesulfonate, and 4-t-butoxycarbonylmethoxy-2,6-dimethylphenyldiphenyl-sulfonium 2,4,6-tris(trifluoromethyl)benzenesulfonate.

4. The radiation-sensitive resin composition according to claim 1, further comprising a photoacid generator other than the component (A).

5. The radiation-sensitive resin composition according to claim 4, wherein the photoacid generator other than the component (A) is at least one compound selected from the group consisting of onium salt compounds, sulfone compounds, sulfonate compounds, sulfonimide compounds, diazomethane compounds, and oximesulfonate compounds.

6. The radiation-sensitive resin composition according to claim 4, wherein the photoacid generator other than the component (A) is at least one compound selected from the group consisting of diazomethane compounds and oxime-sulfonate compounds.

7. The radiation-sensitive resin composition according to claim 1, wherein $R^{22}$ in the formula (2) is a methyl group, ethyl group, or cyclohexyl group.

8. The radiation-sensitive resin composition according to claim 1, wherein the recurring unit represented by the formula (2) is a unit obtained by cleavage of a polymerizable unsaturated bond in at least one compound selected from the group consisting of p-(1-methoxyethoxy)styrene, p-(1-ethoxyethoxy)styrene, p-(1-methoxypropoxy)styrene, p-(1-ethoxypropoxy)styrene, and p-(1-cyclohexyloxyethoxy)styrene.

9. The radiation-sensitive resin composition according to claim 1, wherein the resin (B) comprises a recurring unit other than the recurring units represented by the formula (2) or formula (3).

10. The radiation-sensitive resin composition according to claim 8, wherein the recurring unit other than the recurring units represented by the formula (2) or formula (3) is a unit obtained by cleavage of a polymerizable unsaturated bond in at least one compound selected from the group consisting of styrene, α-methylstyrene, p-t-butoxystyrene, p-t-butoxycarbonyloxystyrene, p-t-butoxycarbonylmethyloxystyrene, p-acetoxystyrene, p-(2-butoxycarbonylethyloxy)styrene, t-butyl(meth)acrylate, isobornyl (meth)acrylate, tricyclodecanyl (meth)acrylate, 2-adamantyl-2-methyl (meth)acrylate, and 2-adamantyl-2-ethyl (meth)acrylate.

11. The radiation-sensitive resin composition according to claim 1, wherein the resin (B) is a resin having a structure partially cross-linked by a cross-linker.

12. The radiation-sensitive resin composition according to claim 1, wherein the number of the recurring units represented by the formula (2) in the resin (B) is 5–90% of the total number of the recurring units represented by the formula (2) and the recurring units represented by the formula (3).

13. The radiation-sensitive resin composition according to claim 1, further comprising an acid-dissociable group-containing resin other than the resin (B).

14. The radiation-sensitive resin composition according to claim 13, wherein the acid-dissociable group-containing resin other than the resin (B) is a resin insoluble or scarcely soluble in alkali having a structure in which the hydrogen atom of an acidic functional group in an alkali-soluble resin having at least one recurring unit shown by the following formulas (6) to (8) is replaced by a substituted methyl group, 1-substituted ethyl group, 1-substituted propyl group, 1-branched alkyl group, silyl group, germyl group, alkoxycarbonyl group, acyl group, or cyclic acid-dissociable group,

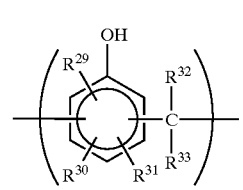
(6)

wherein $R^{26}$ represents a hydrogen atom or a methyl group, $R^{27}$ is a halogen atom or an organic group having 1–6 carbon atoms, and n is an integer of 0–3;

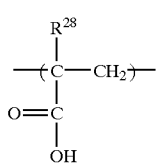
(7)

wherein $R^{28}$ represents a hydrogen atom or a methyl group; and

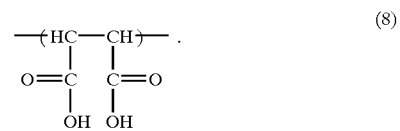
(8)

15. The radiation-sensitive resin composition according to claim 13, wherein the acid-dissociable group-containing resin other than the resin (B) is a resin insoluble or scarcely soluble in alkali having a structure in which the hydrogen atom of a phenolic hydroxyl group in an alkali-soluble resin having at least one recurring unit shown by the following formula (9) is replaced by a substituted methyl group, 1-substituted ethyl group, 1-substituted propyl group, 1-branched alkyl group, silyl group, germyl group, alkoxycarbonyl group, acyl group, or cyclic acid-dissociable group,

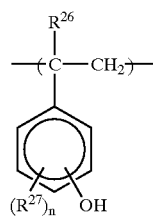
(9)

wherein $R^{29}$, $R^{30}$, $R^{31}$, $R^{32}$, and $R^{33}$ individually represent a hydrogen atom or a linear or branched alkyl group having 1–4 carbon atoms.

16. The radiation-sensitive resin composition according to claim 1, further comprising a dissolution controlling agent.

17. The radiation-sensitive resin composition according to claim 16, wherein the dissolution controlling agent is a compound shown by one of the following formulas (10)–(14):

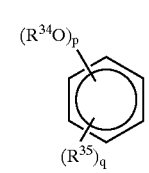
(10)

wherein $R^{34}$ groups individually indicate a hydrogen atom or an acid-dissociable substituent, $R^{35}$ groups individually represent a linear or branched alkyl group having 1–4 carbon atoms, a phenyl group, or a 1-naphthyl group, p is an integer of 1 or more, and q is an integer of 0 or more, provided that $p+q \leq 6$;

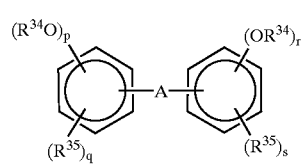
(11)

wherein $R^{34}$ and $R^{35}$ are the same as defined for the above formula (10), and A represents —O—, —S—, —CO—, —COO—, —SO—, —SO$_2$—, —C($R^{36}$)($R^{37}$)—, wherein $R^{36}$ and $R^{37}$ individually represent a hydrogen atom, a linear, branched, or cyclic alkyl group having 1–6 carbon atoms, an acyl group having 2–11 carbon atoms, a phenyl group, or a 1-naphthyl group, or a group shown by the following formula,

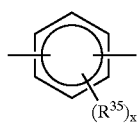

wherein $R^{35}$ is the same as defined above and x is an integer of 0–4, and p, q, r, and s are integers of 0 or more, provided that $p+q\leq 5$, $r+s\leq 5$, and $p+r\geq 1$ are satisfied;

(12)

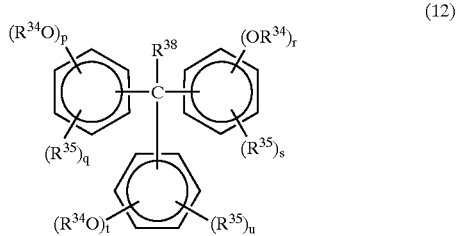

wherein $R^{34}$ and $R^{35}$ are the same as those defined in the formula (10), $R^{38}$ represents a hydrogen atom, a linear or branched alkyl group having 1–4 carbon atoms, or a phenyl group, and p, q, r, s, t, and u are integers of 0 or more, provided that $p+q\leq 5$, $r+s\leq 5$, $t+u\leq 5$, and $p+r+t\geq 1$ are satisfied;

(13)

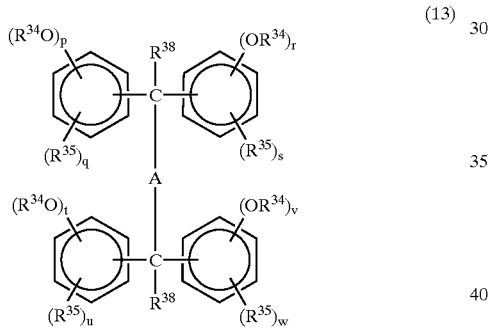

wherein $R^{34}$ and $R^{35}$ are the same as defined for the above formula (10), A is the same as defined in the above formula (11), $R^{38}$ is the same as defined in the formula (12), provided that when two or more $R^{38}$ groups as present, such groups may be either identical or different, and p, q, r, s, t, u, v, and w are integers of 0 or more, provided that $p+q\leq 5$, $r+s\leq 5$, $t+u\leq 5$, $v+w\leq 5$, and $p+r+t+v\geq 1$ are satisfied; and (14)

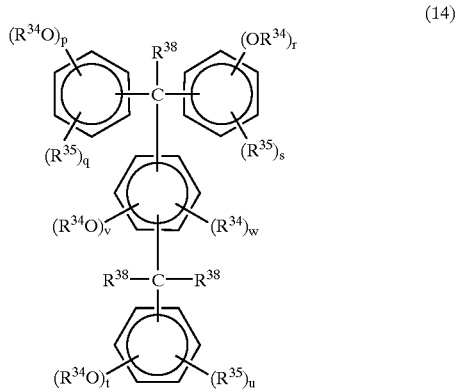

wherein $R^{34}$ and $R^{35}$ are the same as defined for the above formula (10), $R^{38}$ is the same as defined in the formula (12), provided that when two or more $R^{38}$ groups are present, such groups may be either identical or different, and p, q, r, s, t, u, v, and w are integers of 0 or more, provided that $p+q\leq 5$, $r+s\leq 5$, $t+u\leq 5$, $v+w\leq 4$, and $p+r+t+v\geq 1$ are satisfied.

18. The radiation-sensitive resin composition according to claim 1, further comprising an acid diffusion controller.

19. The radiation-sensitive resin composition according to claim 18, wherein the acid diffusion controller is a nitrogen-containing organic compound.

20. The radiation-sensitive resin composition according to claim 1, comprising at least one compound from the group consisting of propylene glycol mono-alkyl ether acetates, lactic acid esters, 3-alkoxypropionic acid esters, 2-heptanone, and cycloheptanone.

21. A positive-tone radiation-sensitive resin composition comprising:

(A) a photoacid generator which is a compound comprising a structure shown by the following formula (1-a) and a structure shown by the following formula (1-b), (1-a)

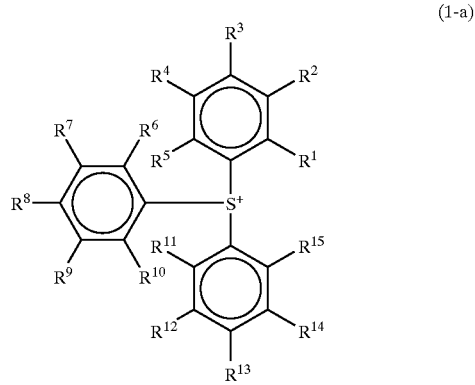

(1-b)

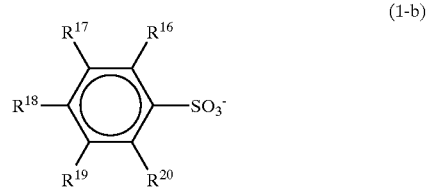

wherein the groups $R^1$ to $R^{15}$ individually represent a hydrogen atom, a hydroxyl group, a linear, branched, or cyclic alkyl group having 1–10 carbon atoms, a linear, branched, or cyclic alkoxyl group having 1–10 carbon atoms, or a t-butoxycarbonylmethoxy group, provided that two or more of the groups $R^1$ to $R^5$ are groups other than the hydrogen atom, two or more of the groups $R^6$ to $R^{10}$ are groups other than the hydrogen atom, or two or more of the groups $R^{11}$ to $R^{15}$ are groups other than the hydrogen atom; and the groups $R^{16}$ to $R^{20}$ individually represent a hydrogen atom, fluorine atom, or trifluoromethyl group, provided that at least one of the groups $R^{16}$ to $R^{20}$ is a fluorine atom or trifluoromethyl group, and (B) a resin comprising a recurring unit shown by the following formula (2),

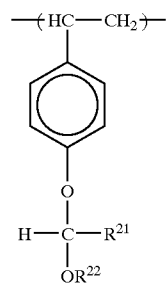
(2)

wherein $R^{21}$ represents a methyl group or ethyl group, and $R^{22}$ represents a linear, branched, or cyclic alkyl group having 1–6 carbon atoms, and a recurring unit shown by the following formula (3)

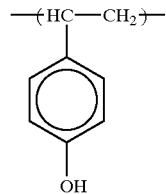
(3)

wherein the photoacid generator is a compound selected from the group consisting of 2,4-dihydroxyphenyldiphenylsulfonium 2,4,6-tris(trifluoromethyl)benzenesulfonate, 2,4-dimethylphenyldiphenylsulfonium 2,3,4,5,6-pentakis(trifluoromethyl)bezenesulfonate, 2,4,6-trimethylphenyldiphenylsulfonium 2,4-difluorobenzenesulfonate, 2,4,6-trimethylphenyldiphenylsulfonium 4-trifluoromethylbenzenesulfonate, 2,4,6-triethylphenyldiphenylsulfonium 4-trifluoromethylbenzenesulfonate, 2,4,6-tri-i-propylphenyldiphenylsulfonium 2,4-difluorobenzenesulfonate, 4-t-butoxy-2,6-dimethylphenyldiphenylsulfonium 2,3,4,5,6-pentafluorobenzenesulfonate, and 4-t-butoxycarbonylmethoxy-2,6-dimethylphenyldiphenyl-sulfonium 2,4,6-tris(trifluoromethyl)benzenesulfonate.

* * * * *